(12) United States Patent
Baxter

(10) Patent No.: US 6,675,309 B1
(45) Date of Patent: *Jan. 6, 2004

(54) METHOD FOR CONTROLLING TIMING IN REDUCED PROGRAMMABLE LOGIC DEVICES

(75) Inventor: Glenn A. Baxter, Scotts Valley, CA (US)

(73) Assignee: Xilinx, Inc., San Jose, CA (US)

( * ) Notice: Subject to any disclaimer, the term of this patent is extended or adjusted under 35 U.S.C. 154(b) by 629 days.

This patent is subject to a terminal disclaimer.

(21) Appl. No.: 09/615,365

(22) Filed: Jul. 13, 2000

(51) Int. Cl.[7] .................................................. G06F 1/04
(52) U.S. Cl. ...................................... 713/401; 713/503
(58) Field of Search .............................. 713/400, 401, 713/500, 503, 600; 716/6, 16, 18

(56) References Cited

U.S. PATENT DOCUMENTS

| | | | |
|---|---|---|---|
| 5,550,839 A | | 8/1996 | Buch et al. |
| 5,648,913 A | * | 7/1997 | Bennett et al. ............... 716/6 |
| 5,778,216 A | * | 7/1998 | Venkatesh .................. 713/503 |
| 5,815,405 A | | 9/1998 | Baxter |
| 6,038,386 A | * | 3/2000 | Jain ........................... 716/16 |
| 6,526,563 B1 | * | 2/2003 | Baxter ......................... 716/18 |

OTHER PUBLICATIONS

The Programmable Logic Data Book, available from Xilinx, Inc., 2100 Logic Drive, San Jose, California 95124, published Jan. 1998, pp. 4–46 to 4–59.

* cited by examiner

Primary Examiner—Dennis M. Butler
(74) Attorney, Agent, or Firm—Edward S. Mao; Lois D. Cartier

(57) ABSTRACT

Method and circuits to create reduced field programmable gate arrays (RFPGA) from the configuration data of field programmable gate arrays (FPGA) are disclosed. The configurable elements of the FPGA are replaced with standard cell circuits that reproduce the functionality of the configured FPGA. Specifically, reduced logic blocks are derived from the configuration data of configurable logic blocks. The reduced logic blocks are arranged in a similar layout to the original CLBs so that timing relationships remain similar in the RFPGA and FPGA. The actual timing of the RFPGA can be modified by increasing or decreasing the timing delay on various signal paths based on the FPGA design or additional timing constraints. To reduce the time required to generate RFPGAs, a database can be used to contain configurable logic block models and the corresponding reduced logic block models.

10 Claims, 20 Drawing Sheets

METHOD FOR CONTROLLING TIMING IN REDUCED PROGRAMMABLE LOGIC DEVICES

BACKGROUND OF THE INVENTION

1. Field of the Invention

The present invention relates to integrated circuits (ICs) such as field programmable gate arrays (FPGAs). More specifically, the present invention relates to methods for converting FPGAs into standard cell integrated circuits.

2. Discussion of Related Art

FIG. 1 is a simplified schematic diagram of a conventional FPGA 110. FPGA 110 includes user logic circuits such as input/output blocks (IOBs) 160, configurable logic blocks (CLBs) 150, and programmable interconnect 130, which contains programmable switch matrices (PSMs). Each IOB 160 includes a bonding pad (not shown) to connect the various user logic circuits to pins (not shown) of FPGA 110. Some FPGAs separate the bonding pad from the IOB and may include multiple IOBs for each bonding pad. Each IOB 160 and CLB 150 can be configured through configuration port 120 to perform a variety of functions. Configuration port 120 is typically coupled to external pins of FPGA 110 through various bonding pads to provide an interface for external configuration devices to program the FPGA. Programmable interconnect 130 can be configured to provide electrical connections between the various CLBs and IOBs by configuring the PSMs and other programmable interconnect points (PIPS, not shown) through configuration port 120. IOBs can be configured to drive output signals to the corresponding pin of the FPGA, to receive input signals from the corresponding pins of FPGA 110, or to be bi-directional.

FPGA 110 also includes dedicated internal logic. Dedicated internal logic performs specific functions and can only be minimally configured by a user. Configuration port 120 is one example of dedicated internal logic. Other examples may include dedicated clock nets (not shown), delay lock loops (DLL) 180, block RAM (not shown), power distribution grids (not shown), and boundary scan logic 170 (i.e. IEEE Boundary Scan Standard 1149.1, not shown).

FPGA 110 is illustrated with 16 CLBs, 16 IOBs, and 9 PSMs for clarity only. Actual FPGAs may contain thousands of CLBs, thousands of PSMs, hundreds of IOBs, and hundreds of pads. Furthermore, FPGA 110 is not drawn to scale. For example, a typical pad in an IOB may occupy more area than a CLB, or PSM. The ratio of the number of CLBs, IOBs, PSMs, and pads can also vary.

FPGA 110 also includes dedicated configuration logic circuits to program the user logic circuits. Specifically, each CLB, IOB, and PSM contains a configuration memory (not shown) which must be configured before each CLB, IOB, or PSM can perform a specified function. Typically, the configuration memories within an FPGA use static random access memory (SRAM) cells. The configuration memories of FPGA 110 are connected by a configuration structure (not shown) to configuration port 120 through a configuration access port (CAP) 125. A configuration port (a set of pins used during the configuration process) provides an interface for external configuration devices to program the FPGA. The configuration memories are typically arranged in rows and columns. The columns are loaded from a frame register which is in turn sequentially loaded from one or more sequential bitstreams. (The frame register is part of the configuration structure referenced above.) In FPGA 110, configuration access port 125 is essentially a bus access point that provides access from configuration port 120 to the configuration structure of FPGA 110.

FIG. 2 illustrates a conventional method used to configure FPGA 110. Specifically, FPGA 110 is coupled to a configuration device 230, such as a serial programmable read only memory (SPROM), an electrically programmable read only memory (EPROM), or a microprocessor. Configuration port 120 receives configuration data, usually in the form of a configuration bitstream, from configuration device 230. Typically, configuration port 120 contains a set of mode pins, a clock pin and a configuration data input pin. Configuration data from configuration device 230 is typically transferred serially to FPGA 110 through a configuration data input pin. In some embodiments of FPGA 110, configuration port 120 comprises a set of configuration data input pins to increase the data transfer rate between configuration device 230 and FPGA 110 by transferring data in parallel. Further, some FPGAs allow configuration through a boundary scan chain. Specific examples for configuring various FPGAs can be found on pages 4–46 to 4–59 of "The Programmable Logic Data Book", published in January, 1998 by Xilinx, Inc., and available from Xilinx, Inc., 2100 Logic Drive, San Jose, Calif. 95124, which pages are incorporated herein by reference.

Design engineers incorporate FPGAs into systems due to the flexibility provided by an FPGA. Because FPGAs are programmable and re-programmable, a design engineer can easily accommodate changes to the system specification, correct errors in the system, or make improvements to the system by reprogramming the FPGA. However, once the system design is complete, the flexibility provided by the programmability of an FPGA is sometimes not required. Furthermore, because FPGAs are relatively costly ICs and FPGAs require a configuration device which also increases cost, mass produced systems may not tolerate the cost of including FPGAs. Thus, in some systems that are mass produced, FPGAs used in the design phase of the system are replaced by less costly integrated circuits.

Most FPGA manufacturers provide a method to convert an FPGA design into a less costly integrated circuits. For example, some FPGA manufacturers replace the programmable elements of an FPGA with metal connections based on the design file of the FPGA to produce a mask programmed IC. All other circuitry remains the same between the mask programmed IC and the FPGA. The mask programmed IC is cheaper to manufacture than the FPGA and eliminates the need for the configuration device in the mass produced system. However, the mask programmed IC may still be more costly than desired because the semiconductor area, which is a major factor in the cost of an IC, required by the mask programmed IC is nearly the same as the FPGA. Consequently, the manufacturing cost of the mask programmed IC is not significantly cheaper than the FPGA.

Some manufacturers use a "sea-of-gates" approach to map an FPGA design into an application specific integrated circuit (ASIC). Specifically, the used CLBs, IOBs, memory cells, and programmable interconnect logic of the FPGA are mapped into corresponding areas of a gate array base. See for example U.S. Pat. No. 5,550,839 entitled "Mask-Programmed Integrated Circuits Having Timing and Logic Compatibility to User-Configured Logic Arrays" and U.S. Pat. No. 5,815,405 entitled "Method and Apparatus for Converting a Programmable Logic Device Representation of a circuit into a second representation of the circuit." However, "sea-of-gates" gate arrays are not well suited to reproduce the extensive routing and other circuits available in an FPGA. Thus, gate array implementation of FPGA designs may prove costly for FPGA designs requiring extensive routing. Hence, there is a need for a method and structure to convert an FPGA design into an integrated circuit which minimizes the cost of the integrated circuit by reducing the size of the integrated circuit.

SUMMARY

The present invention replaces FPGAs with cost effective reduced FPGAs (RFPGAs)for high volume production. Specifically, the present invention uses a completed FPGA design file to design a specific RFPGA with all the functionality of the FPGA design. However, the resulting RFPGA can be manufactured using standard cell techniques which greatly reduces the cost of the RFPGA as compared to the FPGA. Furthermore, the present invention minimizes the semiconductor area of the RFPGA which further reduces the cost of the RFPGA. Additionally, the RFPGA can allow device package changes to further reduce the cost of the RFPGA.

Specifically, in one embodiment of the present invention, models for the configured configurable logic blocks (CLBs), input/output blocks (IOBs), and programmable switch matrices (PSMs) are extracted from the FPGA design file. Then, a reduced logic block (RLB) model is created for each CLB model. Similarly, a reduced input/output block (RIOB) model is created for each IOB model, and a routing matrix (RM) model is created for each PSM model. Additionally, used dedicated internal logic such as block RAMs and boundary scan are extracted from the FPGA and models for each instance are instantiated into the RPFGA.

Specifically, in one embodiment of the present invention, the RFGPA includes a non-uniform array of logic blocks surrounded by a plurality of input/output blocks. An interconnect structure having a plurality of routing matrices connects the various logic blocks within the non-uniform array of logic blocks. The logic block of the non-uniform array of logic blocks are reduced logic blocks which correspond to the configurable logic blocks of an FPGA design. Similarly, the input/output blocks are reduced versions of the IOBs of the FPGA design.

In accordance with another embodiment of the present invention, an integrated circuit includes a first plurality of logic circuits, a routing ring surrounding the first plurality of logic circuits, and a second plurality of logic circuits outside the routing ring. The routing ring has an internal routing grid and an external routing grid. The pitch of the internal routing grid and the external routing grid may differ. The first plurality of logic circuits are placed on the internal routing grid while the second plurality of logic circuits are placed on the external routing grid. The routing ring may include a plurality of wires each having a first endpoint on the internal routing grid and a second endpoint on the external routing grid.

Furthermore, many embodiments of the present invention control timing of the RFPGA. For example, after the RFGA model is created, the timing characteristics of the RFPGA are extracted and compared to various signal timing constraints. The signal paths which do not satisfy the signal timing constraints are modified to satisfy the signal timing constraints. For example, additional timing buffers or vias may be added to a signal path to increase the timing delay of a signal path. Alternatively, the signal path may be rerouted to decrease the timing delay.

Because creation of RLB and RIOB models can be very time consuming, some embodiments of the present invention use a CLB and IOB database to reduce the time required to create the RFPGA. Specifically, a CLB database would contain corresponding RLB models for particular CLB models. If the CLB database does not include a corresponding RLB model, a new RLB model is created and stored in the CLB database. The IOB database would work in a similar manner.

The present invention will be more fully understood in view of the following description and drawings.

DETAILED DESCRIPTION

Figure 3:
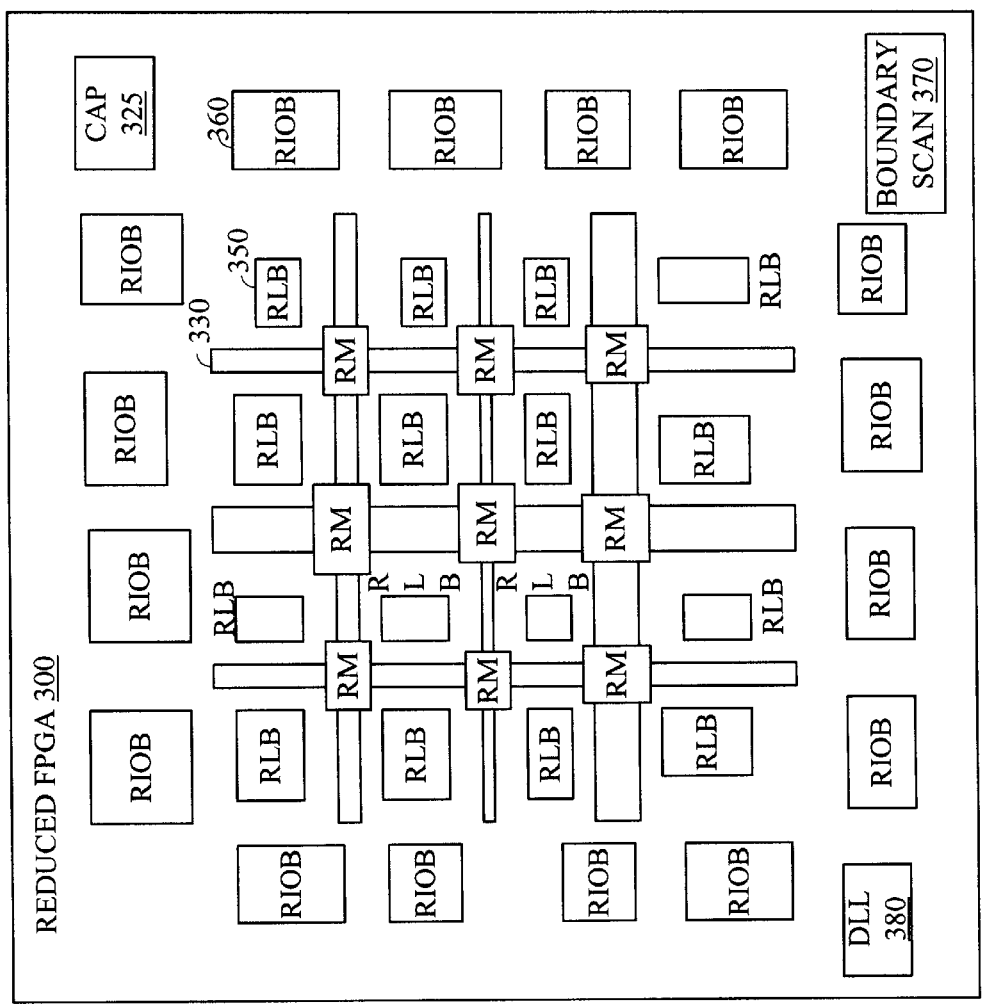
FIG. 3 is a simplified block diagram of a reduced FPGA in accordance with one embodiment of the present invention.

In accordance with the present invention, FPGA designs are converted into integrated circuits that are formed using standard cell libraries. Each part of the FPGA is reduced so that the standard cell implementation of the FPGA requires only a small amount of semiconductor area as compared to a standard FPGA or standard gate array. FIG. 3 is a simplified schematic diagram of a reduced FPGA (RFPGA) 300 in accordance with one embodiment of the present invention. As used herein, "reduced FPGA" refers to a integrated circuit which performs the function of the FPGA design file but can be manufactured using standard cell libraries. Specifically, in RFPGA 300, CLBs are replaced with reduced logic blocks (RLBs) 350, IOBs are replaced by reduced input/output blocks (RIOBs) 360, programmable interconnect is replaced with reduced interconnect 330, in which PSMs are replaced by routing matricés (RM). Furthermore, dedicated logic such as digital lock loops (DLLs), boundary scan logic, and configuration access ports, can be replaced by circuits, such as CAP 325, boundary scan 370, and DLL 380, having equivalent logic functions but tailored for the RFPGA. Specific reduction techniques for CLBs, IOBS, and programmable interconnect 130, including PSMs, are discussed below. Generally, each CLB, IOB, and PSM is individually reduced to use as little semiconductor area as possible. The reduced parts are then arranged in the RFPGA in the same basic arrangement as the original FPGA. Thus, a RFPGA contains an array of non-uniform RLBs, interspersed with a non-uniform array of RMs and a non-uniform reduced interconnect surrounded by non-uniform RIOBs. However some embodiments of the present invention use the same amount of area for each RLB to allow a uniform array of RLBs. Furthermore, some embodiments of the present invention may combine programmable features with RLBs, RIOBs, and RMs to create partially configurable RFPGAs. In these embodiments, the portions of the FPGA which must remain programmable can be built directly from the FPGA design while the remaining portions can be converted to RFGPA elements as described below.

Each row of RLBs has a height equal to the tallest RLB in the row. Similarly, each column of RLBs has a width equal to the width of the widest RLB in the column. The spacing between different rows and columns of the RFPGA can vary depending on the semiconductor area required by reduced interconnect 330 and the various routing matrices. Like the RLBs, the width and height required by the rows and columns of RIOBs is dictated by the tallest and widest RIOB of each row and column, respectively. Furthermore, in some embodiments, the width and height required by the rows and columns of RIOBs is also dependent of the width and height of the RLB columns and rows.

Figure 4A:
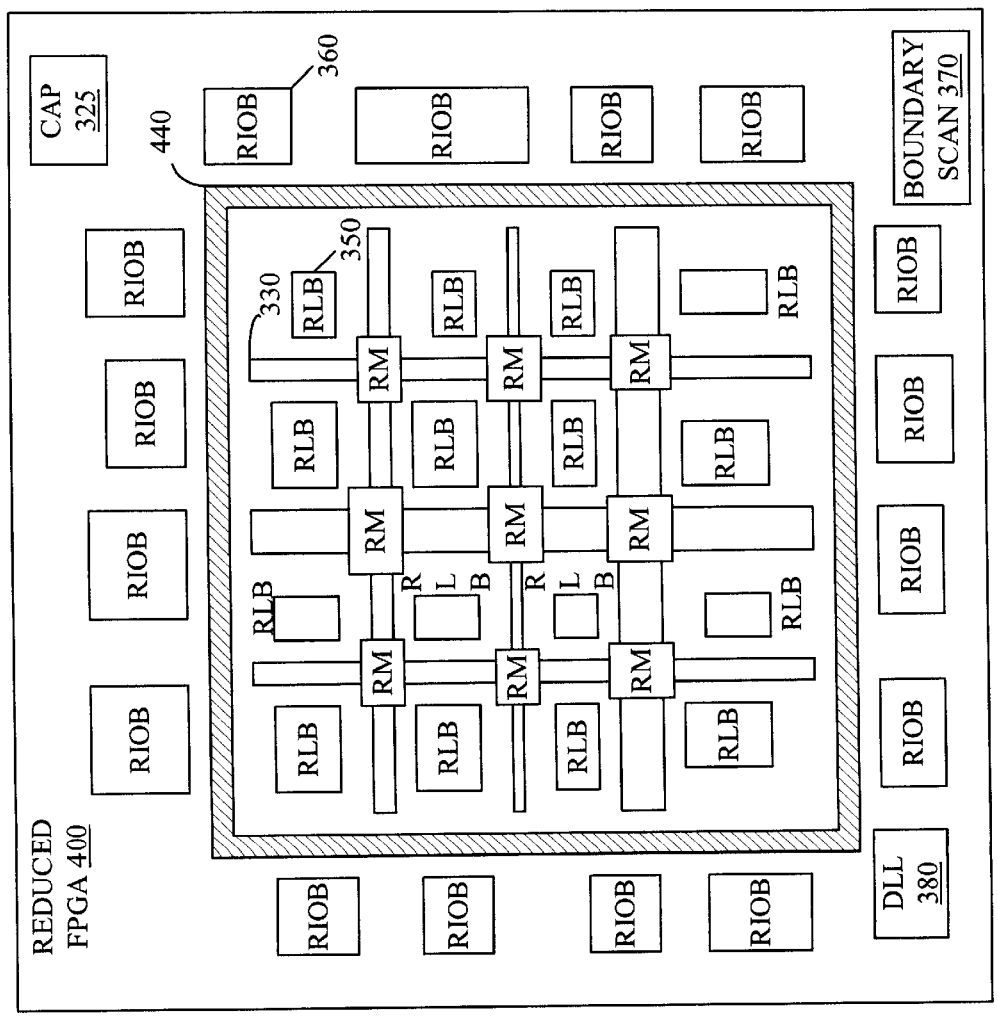
FIG. 4(a) is another simplified block diagram of a reduced FPGA accordance with one embodiment of the present invention.

FIG. 4(a) is a simplified schematic diagram of a RFPGA 400, in accordance with a second embodiment of the present invention. RFPGA 400 differs from RFPGA 300 by including a routing ring 440. In some embodiments, routing ring 440 begins as allocated area on RFPGA 300. Later, a routing process can be used to fill the allocated area of routing ring 440 with wire paths connecting the RLBs to RIOBs.

Figure 4B:
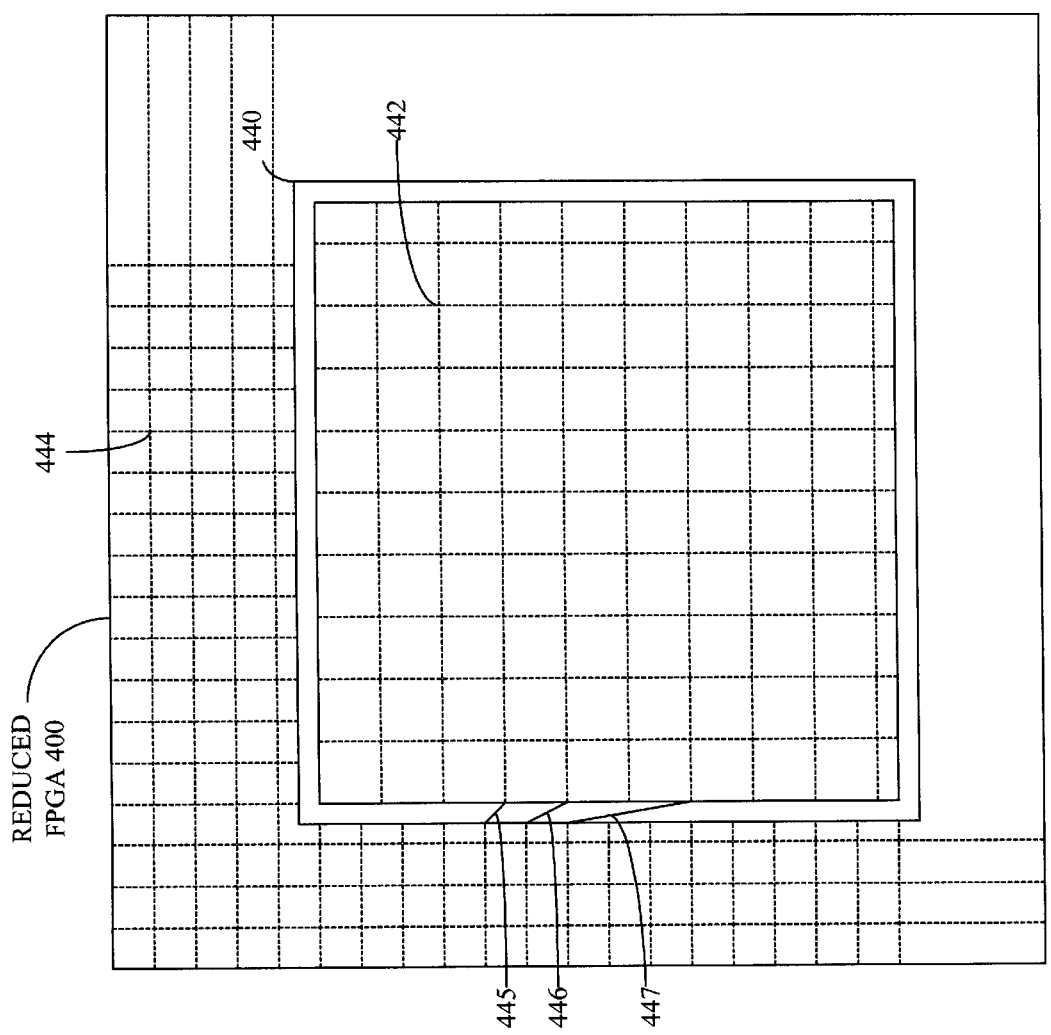
FIG. 4(b) is a simplified diagram of the internal and external routing grids of an reduced FPGA.

However, in other embodiments, routing ring 440 allows the RIOBs to use a different routing pitch than the components of RFPGA 400 within routing ring 440. As shown in FIG. 4(b), routing ring 440 has an internal routing grid 442 that matches the routing pitch used by the RLBs, RMs, and reduced interconnect. Routing ring 440 also has an external routing grid 444 that matches the routing pitch of the RIOBs. For example, the routing pitch of the internal routing grid may be larger or smaller than the routing pitch of the external routing grid. Furthermore, the internal and external routing grids may have the same routing pitch but are not aligned. Also shown in FIG. 4(b) are routing ring wires 445, 446, and 447, which illustrate disparate pitch components on internal routing grid 442 and external routing grid 444 being connected by straight line connections in accordance with one embodiment of the present invention. Furthermore, because routing ring 440 allows different routing pitches to be used in RFPGA 400, the reduction of the RIOBs can be optimized for one routing grid and the reduction of the other components of RFPGA 400 can be optimized for a second routing grid. Furthermore, by having separate routing grids for the RIOBs and the RLBs, RIOBs corresponding to unused IOBs can be removed from RFPGA 400.

Figure 5:
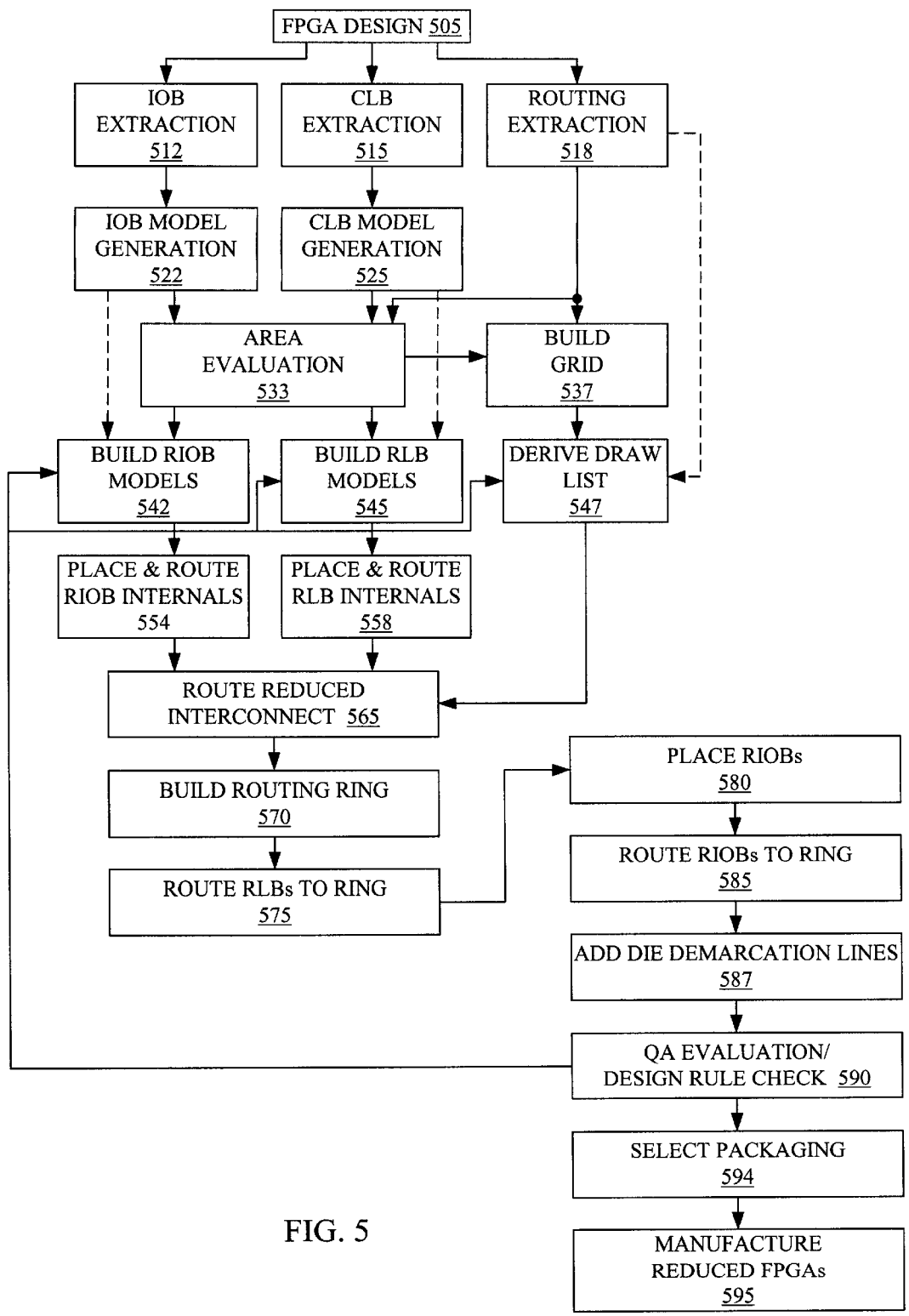
FIG. 5 is a flow diagram of a method to convert an FPGA design file into a reduced FPGA in accordance with one embodiment of the present invention.

FIG. 5 is a flow diagram for a method to convert an FPGA design 505 into a RFPGA. In FIG. 5, dashed arrows represent information flow between steps. Solid arrows represent process flow which may also include information flow. Each step can be performed as soon as all the necessary information is provided from other steps. For clarity, the techniques used to resolve timing issues in RFPGAs are discussed with respect to FIG. 14 after discussion of the conversion of an FPGA to an RFPGA. The configuration data for IOBs, CLBs, and the programmable interconnect including the PSMs (i.e. the routing information), are extracted in IOB extraction step 512, CLB extraction step 515, and routing extraction step 518, respectively. Extraction of configuration data for IOBs, CLBs, and routing information is well known in the art of FPGA programming. For example, a "compile away" method for extracting configuration data for IOBs is described by Baxter in U.S. Pat. No. 5,815,405 entitled "Method and Apparatus for Converting a Programmable Logic Device Representation of a Circuit into a Second Representation of the Circuit." Other well known methods, such as "instantiate only required components," can also be used. IOB extraction step 512, CLB extraction step 515, and routing extraction step 518 can be performed in parallel or in series. After extracting the configuration data for IOBs and CLBs, IOB models and CLB models are generated in IOB model generation step 522 and CLB model generation step 525, respectively. Specifically, in IOB model generation step 522, a model for each IOB is generated using well known techniques, such as those described in U.S. Pat. No. 5,815,405. Similarly, a model for each CLB is generated using well known techniques, such as those described in U.S. Pat. No. 5,815,405, in CLB model generation step 525.

Once the models for the CLBs and IOBs are built, an estimate for the area required by each RIOB, RLB, RM, and reduced interconnect 330 is derived in area evaluation step 533. By calculating an approximation for the area of each RLB, each RM, and reduced interconnect, an optimal grid pitch can be determined for the non-uniform array of RLBs. However, this optimal grid pitch must obey the silicon device layout rules used to manufacture the RFPGA. Similarly, by calculating an approximation for the area of each RIOB, an optimal grid pitch can be determined for the RIOBs surrounding routing ring 440. In one embodiment, the grid pitch is chosen to fit the largest row and column. Then the sizes of the other rows and columns are adjusted to fit the chosen grid pitch. In another embodiment, a variable grid pitch is determined by the actual size of each row and column. After determining the optimal grid pitch, the routing grid for the non-uniform array of RLBs inside routing ring 440 (FIG. 4(b)) and the routing grid for the RIOBs outside of routing ring 440 are built in a build grid step 537. In some embodiments of the present invention, the vertical pitch may differ from the horizontal pitch. This non-square pitch is often used to take advantage of additional metal layers that were either unused or unavailable in the original FPGA design.

Using the IOB models and the area approximations for RIOBs, a model for each RIOB is created in a build RIOB models step 542. Similarly, using CLB models and the area approximations for RLBs, a model for each RLB is created in a build RLB models step 545. Specific methods and techniques in accordance with the present invention to reduce CLBs into RLBs and to reduce IOBs into RIOBs are described below. The draw list for the reduced interconnect, including the RMs, is produced in a derive draw list step 547. Methods and techniques used to form reduced interconnect 330 from programmable interconnect 130 are described below.

After deriving the RIOB models, the components of each RIOB model are conceptually placed in a layout design and the RIOB model is internally routed in a place & route RIOB internals step 554. Similarly, after deriving the CLB models, the components of each RLB model are conceptually placed and the RLB model is internally routed using in a place & route RLB internals step 558.

Then the RLB models are arranged relative to each other for placement on a die. Specifically, techniques for placing and routing semiconductor devices from models are well known in the art and are not discussed in detail herein. However, because the structure of an RFPGA is very similar to the original FPGA, relative placement of blocks from the FPGA can be used for almost all components of the RFPGA. Routing simply follows the optimized routing for the original FPGA. For example, the relative placement of the RLBs to each other is the same as relative placement of the corresponding CLBs to each other. For example, if two RLBs correspond to adjacent CLBs, the two RLBs are placed adjacent to each other. However, optimizations to reduce area are possible due to the elimination of unused structures of the original FPGA. The RLBs are placed on the internal routing grid and interconnected by routing reduced interconnect 330 in a route reduced interconnect step 565. As described below, most embodiments of reduced interconnect 330 are metal wires and vias. Consequently, conventional routing techniques can be used with the draw list of reduced interconnect 330. In general, special tools are not required because the actual relative coordinates of each wire segment are known and used, with possible changes due to different routing grids.

For embodiments of the present invention using routing ring 440, e.g. RFPGA 400, routing ring 440 is built in build routing ring step 570. Routing ring 440 is made up of simple wiring connections between points on the internal routing grid and points on an external grid pitch. Specifically, each wire in routing ring 440 has a first endpoint on the internal routing grid and a second endpoint on the external routing grid. The locations of the first endpoints of the wires in routing ring 440 are dictated by the placement of the RLBs and the locations of the second endpoint are dictated by the placement of the RIOBs. In accordance with one embodiment of the present invention, standard routing tools can be used by defining a routing grid in routing ring 440 equal to the lowest common multiple of both the internal routing grid and the external routing grid. After building the routing ring, the connections from the RLBS are routed to routing ring 440 in route RLBs to ring step 575. Because routing ring 440 is used to connect RLBs to nearby RIOBs, the connections between the RLBs and RIOBs can be formed without crossing. Therefore, direct (e.g. straight lines) wiring paths can be used in routing ring 440 (as illustrated in FIG. 4(*b*). Accordingly, the wiring in routing ring 440 may be formed using a single metal layer. However, other embodiments of the present invention may take advantage of the three-dimensional nature of silicon devices to use other types of connections in routing ring 440. For example, some wires in an FPGA may be twisted in various manners due to the limitation of the routing channels of an FPGA. These twisted wires may be untwisted to further reduce the area required by the RFPGA by using routing ring 440. Furthermore, in some embodiments of the present invention, vias, and other active circuits, such as timing buffers, may be added to the wiring paths to increase the propagation delay of the wiring path. Some embodiments may also increase the net length of a wiring path to increase the capacitance of the wiring path to increase the propagation delay of the wiring path.

Then, the RIOBs are placed around routing ring 440 in a place RIOB step 580. The RIOBS are routed to routing ring 440 in a route RIOBs to ring step 585. Lastly, the RFPGA is finished by adding the outer most boundary zone, which is used to place scribe lines accurately on a silicon wafer during manufacturing. This last step is performed in a add die demarcation line step 587. At this point, the RFPGA design is complete.

For embodiments of the present invention which do not include routing ring 440, e.g. RFPGA 300, build routing ring step 570, route RLBs to ring stop 575, and route RIOBs to ring step 585 are omitted. In these embodiments the RIOBs and routed directly to the appropriate RLBs.

Typically a quality assurance(QA)/design rule check step 590 is performed to evaluate the RFPGA design and insure that the RFPGA obeys the semiconductor processing rules of the semiconductor technology which will be used to manufacture the RFPGA. If quality assurance(QA)/design rule check step 590 detects an error in the RFPGA design, processing returns to build RIOB model step 542, build RLB model step 545, or derive draw list step 547, depending on whether the problem occurred in an RIOB, an RLB, or an RM, respectively. After, quality assurance(QA)/design rule check step 590 is satisfied, a suitable package is selected for the RFPGA in select packaging step 594. Because the RFPGA is smaller and may require less pins than the FPGA, a smaller and less expensive package can be used for the FPGA. Actual RFPGAs are produced using conventional standard cell techniques, which are well known in the art, in a manufacture RFPGAs step 595.

Area Evaluation

Area evaluation step 533 is generally a three part process. First each instance of the IOBs and CLBs is evaluated to determine the approximate area value required by the corresponding RIOB and RLB. Second, each instance of the PSMs is evaluated to determine the area requirements of the corresponding RM. Third, an overall evaluation for the area required by the RFGPA is performed.

For each instance of an IOB or CLB, the area required by the components (i.e. at the gate or transistor level) needed to implement the function of the IOB or CLB is determined. In some embodiment of the present invention, multiple alternative implementations of the functions of an IOB or CLB are available. For example, a particular CLB may have four different gate/transistor RLB designs that each implement the function of the CLB. The different implementations will have different height and width requirements. Picking the gate/transistor RLB design with the minimum area may not lead to the smallest overall area for the RFPGA. Thus, some embodiments of the present invention choose the gate/ transistor RLB design based on the height and width of other RLBs in the row or column to minimize the overall area required for the RFPGA. Next, the approximate area required for the RIOB or RLB is determined by multiplying the area required by the components by a guard band factor. Typically the guard band factor is determined experimentally and is used to include an approximate value of the area required for internally routing the RLB or RIOB. Even though RFPGA 300 is implemented using standard cell technology, the RLBs and RIOBs are still somewhat tiled in RFPGA 300. Typically, RLBs and RIOBs are formed using rectangular shapes, however, tetragonal shapes, i.e. polygons formed with only right angles, as well as, other polygonal shapes can be used to reduce the area required by the RLBs and RIOBs.

Once the shape is selected, the size of the shape must be determined. For example, if rectangular shapes are used, the width and length of the rectangular shape must be determined for each RLB and RIOB. Typically, it is desirable to minimize the overall size of the shape used for each RLB and RIOB. However, other criteria may be used. For example, some embodiments of the present invention determine the size of the shape to minimize the interconnect overhead. By allowing the size of the shape to be set by the required interconnect, the smallest size for that shape is possible. After the shape and size of an RLB or RIOB is determined, interconnect points are placed around the shape in a standardized method so that the RLBs and RIOBs can interconnect in a known manner. In one embodiment the layout of pins of the various models of the RFPGA is in the same physical order as the corresponding pins of the FPGA, but on a reduced area basis.

In some embodiments of the present invention, the size of the RLBs are not determined individually. Specifically, the size of each RLB is determined with the goal of minimizing the width of each RLB column and the height of each RLB row. Thus, the height of an RLB is set by the minimum height of the tallest RLB in the row. Similarly, the width of an RLB is set by the minimum width of the widest RLB in the row. During layout of the RLBs or RIOBs alternative shapes may be chosen to optimize the area requirement of the row or column.

Once the RLB and RIOBs shapes and sizes have been determined, the area required by the RMs can be determined. Many factors may dictate the area required by the RMs. For example, factors may include the number of metal layers used by the RMs, the maximum length of an unbuffered interconnect line, the minimum distance between adjacent interconnects, and other technology specific rules. Furthermore, in some embodiment of the present invention the area for the RMs may need to be expanded to include buffers for timing matching. Each RM is then evaluated to determine which wires and vias can be removed as well as which wires and vias can be moved. Specific examples of reducing the size of each RM is given below in detail.

Once the area required by each RIOB, RLB, and RM is determined, the area required by an RFPGA can be determined. As illustrated in FIGS. 3, 4(a) and 4(b), the RIOBs are arranged in a rectangular ring shape, whereas the RLBs and the RMs are contained in a rectangular shape within the ring of RIOBs. In some embodiments, the area of the ring of RIOBs is increased to accommodate routing ring 440 (FIG. 4(a)). If the area required by the rectangular shape of the RLBs and RMs is greater than the area within the ring if RIOBs, the area for the ring of RIOBs is increased.

In some embodiment, the RIOBs are treated as two horizontal rows and two vertical columns. Thus, the area within the RIOB ring can be increased by increasing the length of the horizontal rows or vertical columns to accommodate the area requirements of the RLBs and RMs. In other embodiments of the present invention, the area within the RIOB ring is not rectangular. For example, some embodiments use other polygonal shaped areas.

Reduction of CLBs to RLBs

Figure 6:
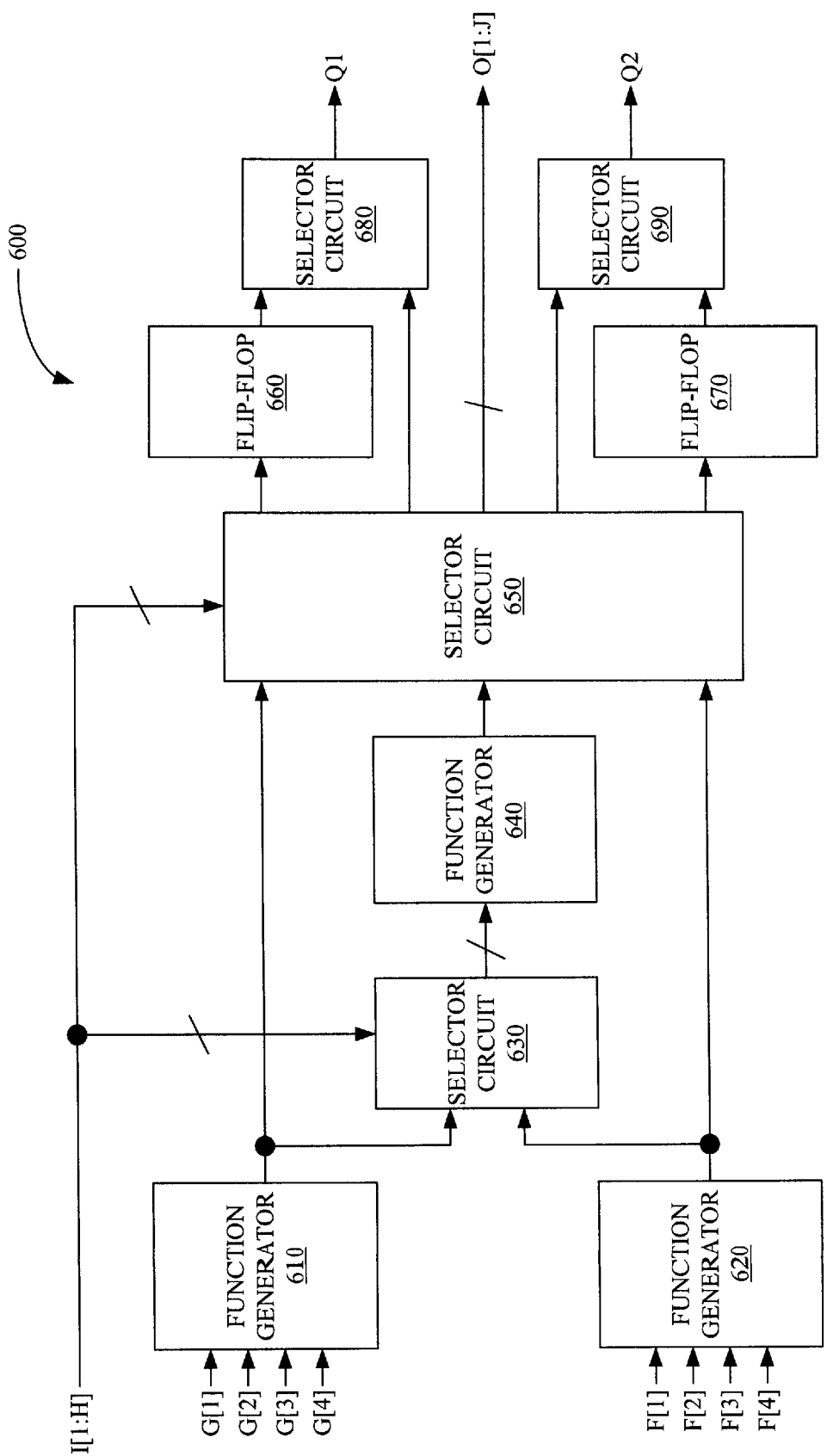
FIG. 6 is a block diagram of a conventional configurable logic block (CLB).

As stated above, each CLB of the FPGA design is individually reduced into an RLB during formation of the RFPGA. Similarly, each component of a CLB is individually reduced to form the RLB. FIG. 6 shows a simplified block diagram of a conventional CLB 600. The present invention is applicable to a variety of CLBs. CLB 600 is merely one example of a CLB that can be used with the present invention. CLB 600 includes a function generator 610, function generators 620 and 640, selector circuits 630, 650, 680, and 690, and flip-flops 660 and 670. CLB 600 performs a variety of logic functions based on the configuration of function generators 610, 620, and 640 and selector circuits 630, 650, 680, and 690. CLB 600 receives input signals I[1:H], G[1:4], and F[1:4]. As used herein, signal names referring to multiple signals are referred to as NAME[X:Y], each individual signal is referred to as NAME[Z]. CLB 600 drives output signals Q1, O[1:J], and Q2.

Function generator 610 can be configured to perform any four-input logic function using input signals G[1], G[2], G[3], and G[4]. Similarly, function generator 620 can be configured to perform any four-input logic function using input signals F[1], F[2], F[3], and F[4]. Although FIG. 6 shows CLB 600 with input signals coming from the left and output signals going to the right, actual CLB layouts in FPGAs may have input signals and output signals on any side of the CLB.

Selector circuit 630 can be configured to select input signals for function generator 640 from input signals I[1:H] and the output signals of function generators 610 and 620. Function generator 640 can be configured to perform any two-input logic function using input signals from selector circuit 630. Typically, selector circuit 630 is formed using one or more multiplexers having selection input terminals coupled to configuration memory cells (not shown).

Selector circuit 650, which is also typically formed using one or more multiplexers having selection input terminals coupled to configuration memory cells, can be configured to select various signals from input signals I[1:H] and the output signals of function generators 610, 620, and 640. Selector circuit 650 drives output signals O[1:J] as well as input signals to flip flop 660, selector circuit 680, selector circuit 690, and flip flop 670. Flip flops 660 and 670 provide registered output signals to selector circuit 680, and 690 respectively. Depending on the specific implementation of CLB 600, flip-flops 660 and 670 may have a variety of configurable clocking options. Selector circuit 680 can be configured to select either the output signal of flip flop 660 or a signal from selector 650 to drive as output signal Q1. Similarly, selector circuit 690 can be configured to select either the output signal of flip flop 680 or a signal from selector 650 to drive as output signal Q2. Selector circuits 680 and 690 are typically formed using a multiplexer having an selection input terminal coupled to a configuration memory cell.

In the conversion of CLB 600 into an RLB, the configuration data for CLB 600 is analyzed to determine how the selector circuits are configured. Once configured, the selector circuits are essentially wired paths. Thus, selector circuits can be replaced by metal and/or semiconductor buffers plus wire paths and vias in RLBs. Flip flops 660 and/or 680 are eliminated from an RLB, if the FPGA design file does not use flip-flops 660 and/or 680. Otherwise, the used flip flops 660 and/or 680 are included in the RLB. The configuration circuitry of the CLB is eliminated. However, in some embodiments of the present invention, RFPGA are partially configurable. Thus, some RLBs may still contain configuration circuits. In general, the area of an RLBs can be reduced from the area of a standard CLBs by eliminating selector circuits, configuration circuits, and unused circuits. In addition, the area required by the function generators of CLB 600 can be substantially reduced as described below with respect to FIGS. 7 and 8.

Figure 7:
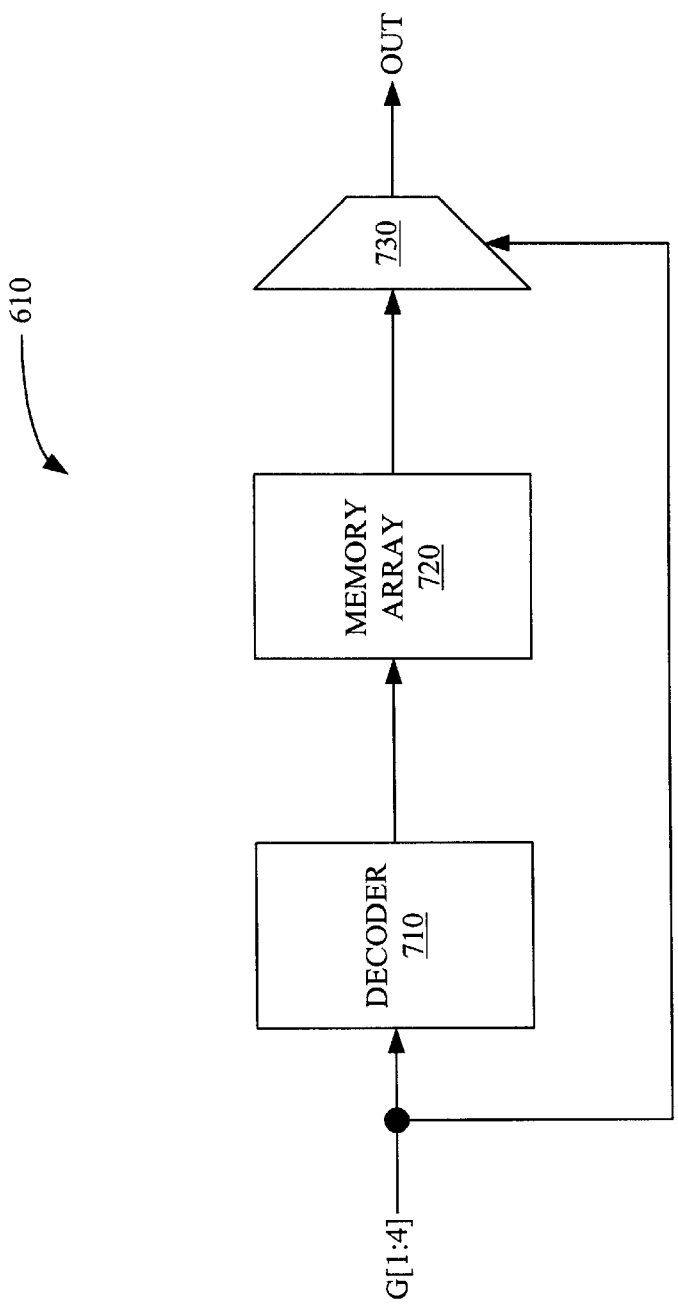
FIG. 7 is a block diagram of a conventional function generator.

FIG. 7 shows a conventional embodiment of function generator 610. The present invention is applicable to a variety of function generators. Function generator 610 comprises a decoder 710, a memory array 720, and a multiplexer 730. Memory array 720 is a 16 bit memory, which is addressed by input signals G[1:4]. Decoder 710 decodes input signals G[1:4] to enable one of the 16 memory bits of memory array 720 to write a value. Multiplexer 730, which is controlled by input signals G[1:4] selects one of the memory bits of memory array 720 to drive an output signal OUT. In some FPGA designs, function generator 610 (FIG. 6) is used only as a four-input logic function. For these FPGA design files, configuration data is stored in memory array 720 to provide the proper output for the 16 possible values of input signals G[1:4]. In other FPGA designs, function generator 610 is configured to act as a random access memory unit. In these FPGA designs, the input terminal of each memory cell is configurably coupled to other user circuits, i.e., CLBs, IOBs, and PSMs.

Figure 8D:
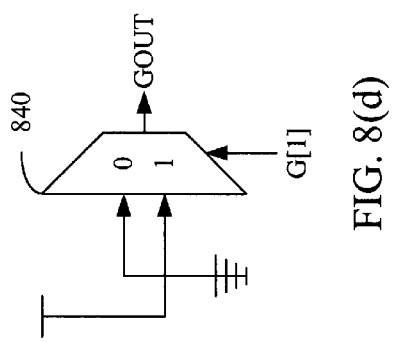
FIGS. 8(a)–8(d) are schematic diagrams of a reduced function generators in accordance with one embodiment of the present invention.
Figure 8C:
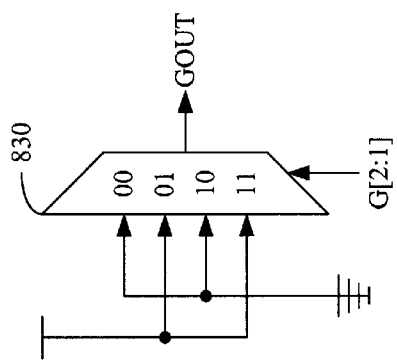
Figure 8B:
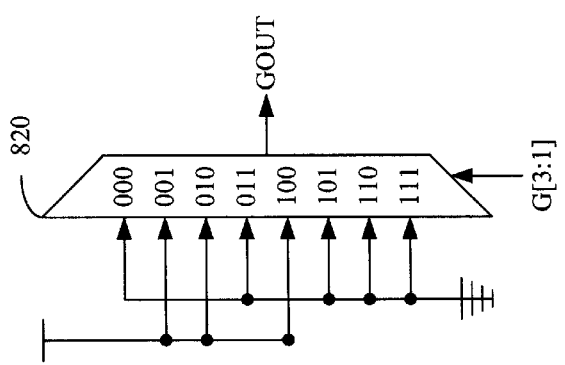
Figure 8A:
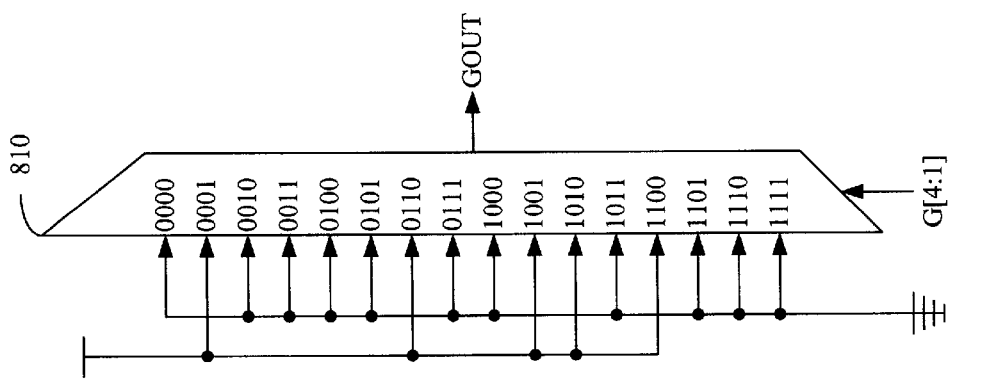

In one embodiment, if the CLB model uses function generator 610 as a logic function, the RLB model replaces decoder 710, memory array 720, and multiplexer 730 with a single multiplexer. As illustrated in FIG. 8(a), if function generator 610 implements a four-input logic function, a 16 input multiplexer replaces function generator 610. The input terminals of multiplexer 810 are coupled to logic high or logic low depending on the function implemented by function generator 610. As illustrated in FIG. 8(b), if function generator 610 implements a three input logic function, an eight input multiplexer 820 replaces function generator 610. Similarly, if function generator 610 implements a two-input logic function, a four input multiplexer 830 (FIG. 8(c)) replaces function generator 610. Similarly, if function generator 610 implements a one-input logic function, a two input multiplexer 840 (FIG. 8(d)) replaces function generator 610. In some embodiments, rather than using multiplexers, the logic function is directly implemented using logic gates, which require less area.

For CLB models using function generator 610 as a memory array, the RLB model must also contain decoder 710, memory array 720, and multiplexer 730. However, some configuration circuits within function generator 610 can be removed which reduces the size of function generator 610. Furthermore, if function generator 610 is used as memory, function generator 610 may be replaced with a compiled RAM cell using well known techniques.

Rather than generating each RLB model during conversion of a FPGA to an RFPGA, some embodiments of the present invention use a database to retrieve a RLB model which corresponds to a CLB model. For example, the manufacturer of an FPGA may create a database including RLB models for every possible CLB configuration in the FPGA. Using such a database would reduce the time necessary to create an RFPGA. However, creation of the database would be very time consuming. Thus, some embodiments of the present invention use a combined approach. Specifically, a partial database is created. If the CLB model is already in the database, then the corresponding RLB model is retrieved. However, if the CLB model is not in the database, then an RLB model is created and stored in the database. In addition, many databases include multiple RLB models for each CLB model. The various RLB models would have different shape parameters. Having multiple differently shaped RLB models for each CLB model allows better optimization of the RFPGA. Thus, in some embodiments, in addition to determining whether the CLB model is in the database, the shape parameter of the a corresponding RLB model is evaluated. If the shape parameter is not sufficient, then a second corresponding RLB model is created and stored in the database. The various database approaches can also be applied to individual elements within the CLB. Furthermore, these databases can also be extended to include RM models and RIOB models.

Figure 9:
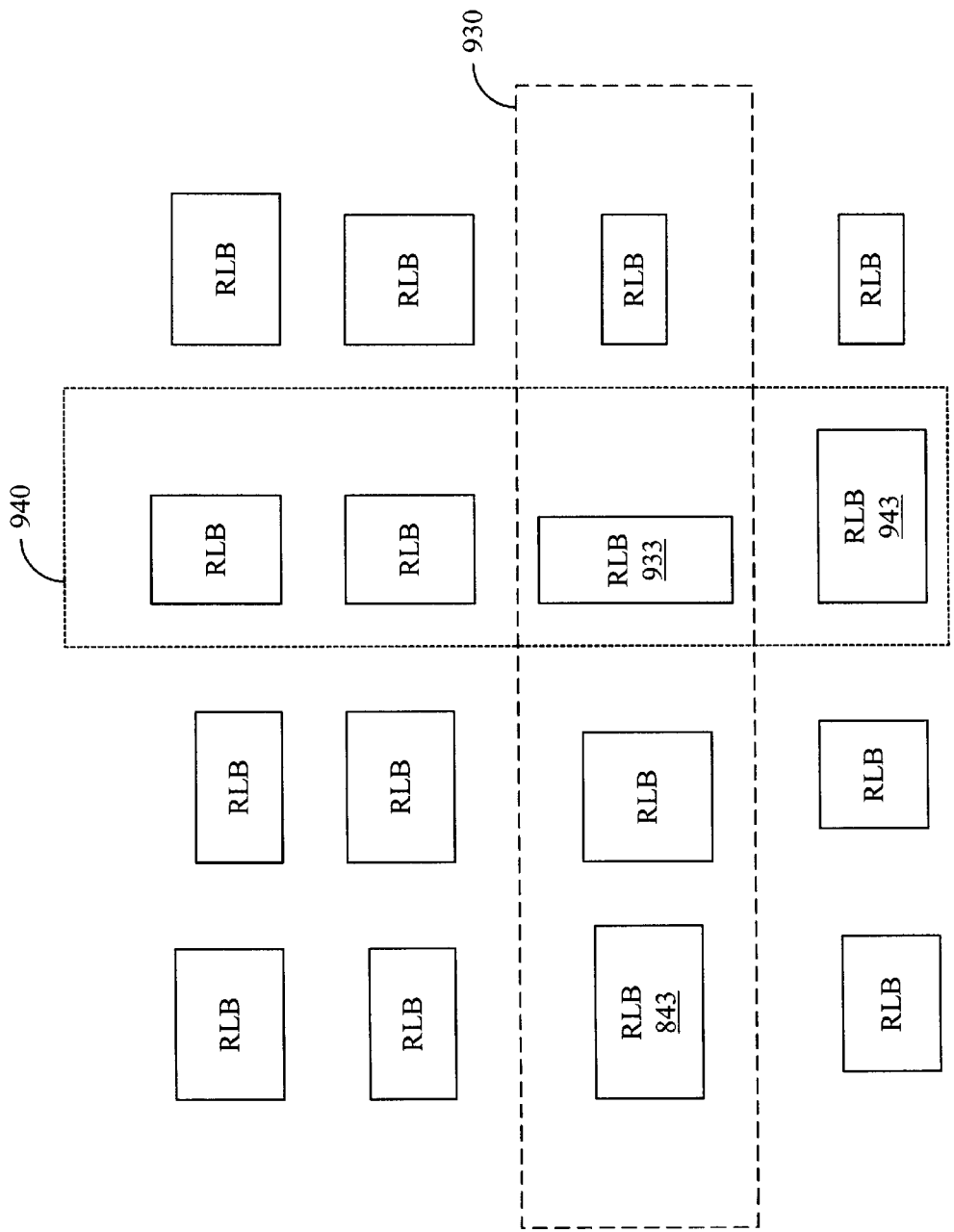
FIG. 9 is a simplified block diagram of a non-uniform array of logic blocks used to illustrate formation of reduced logic blocks (RLBs) in accordance with one embodiment of the present invention.

FIG. 9 illustrates that the height of each RLB row is equal to the height of the tallest RLB. Specifically, the height of RLB row 930 is equal to the height of the RLB 933 (i.e., the tallest RLB in RLB row 930). Thus, in some embodiments of the present invention, after the RLB models are formed, RLB 933 may be rearranged to shorten RLB 933. To shorten RLB 933, RLB 933 is typically widened to provide additional semiconductor area. By shortening RLB 933, the height of RLB row 930 is decreased and the semiconductor area required by the non-uniform array of RLBs is reduced. However, RLB 933 may not be widened beyond the width of RLB 943 (i.e. the widest RLB of RLB column 940) without expanding the width of RLB column 940. The same principle of rearranging RLBs to save semiconductor area within the non-uniform array of RLBs, can be applied to thinning the widest RLB of a column by increasing the height of the widest RLB. In one embodiment of the present invention, a multi-pass area evaluation mechanism is employed to optimize the height and width by adjusting and readjusting each RLB.

In addition, if an FPGA design does not use any CLBs in a row of CLBs, the RFPGA need not include the unused row. Similarly, if an FPGA design does not use any CLBs in a column of CLBs, the RFPGA need not include the unused column. Thus, to optimize conversion to RFPGAs, FPGA design tools can be modified to attempt to pack an FPGA design into a corner of the CLB matrix of the FPGA to maximize the number of unused rows and columns of CLBs, which can be omitted in the RFPGA. Other embodiments may attempt to maximize the number of unused rows and columns of CLBs by moving CLBS. The unused rows and columns can be removed in the RFPGA.

Reduction of the Programable Interconnect

Figure 1:
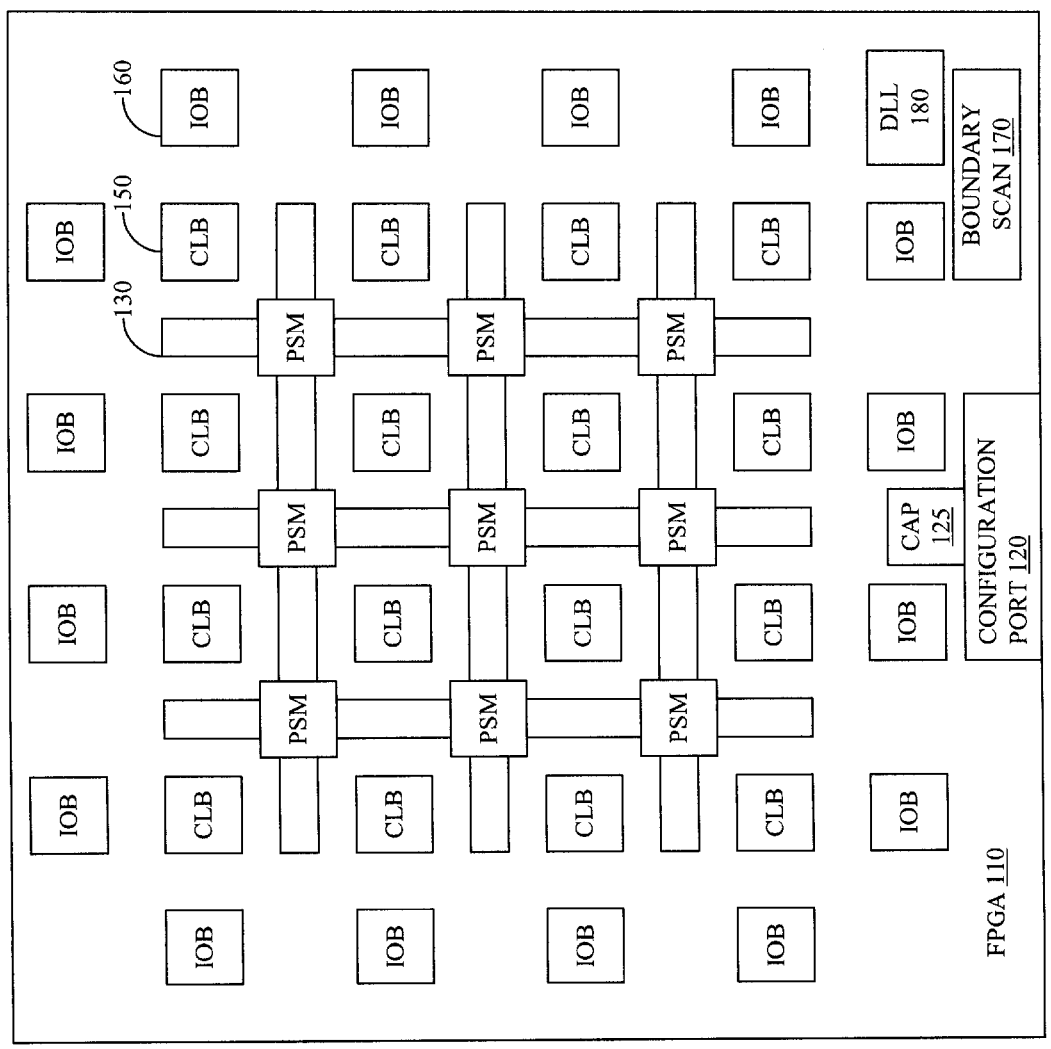
FIG. 1 is a simplified block diagram of a conventional FPGA.
Figure 2:
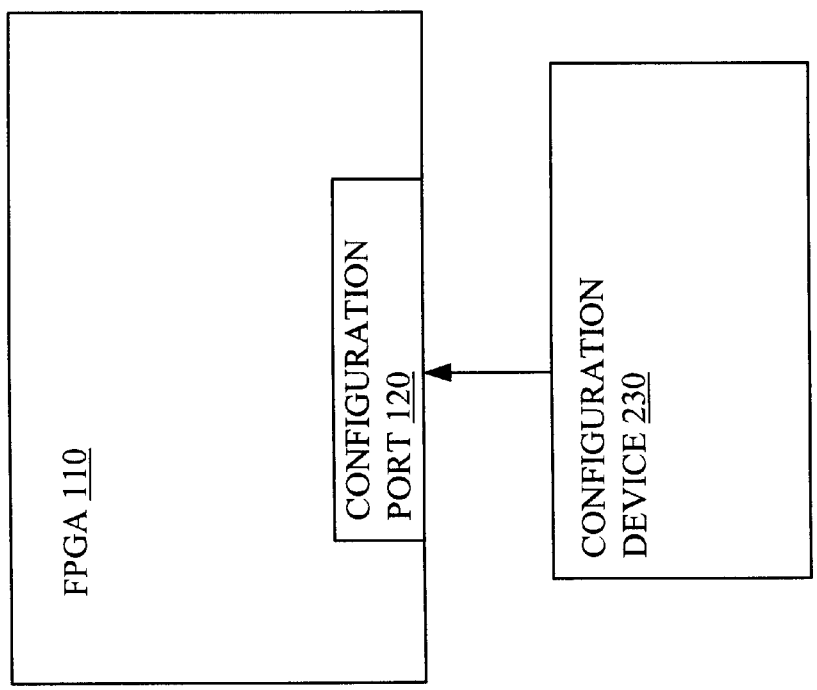
FIG. 2 is a prior art block diagram of an FPGA configured with a configuration device.

As stated above, programmable interconnect 130 of FPGA 100 (FIG. 1) is replaced with reduced interconnect 330 (FIG. 3). However, some embodiments of the present invention, may choose to reroute part or all of programmable interconnect 130 rather than converting programmable interconnect 130 into reduced interconnect 330. The disadvantage of rerouting include possible changes to the timing relationship of signals in programmable interconnect 130 and reduced interconnect 330.

Figure 10:
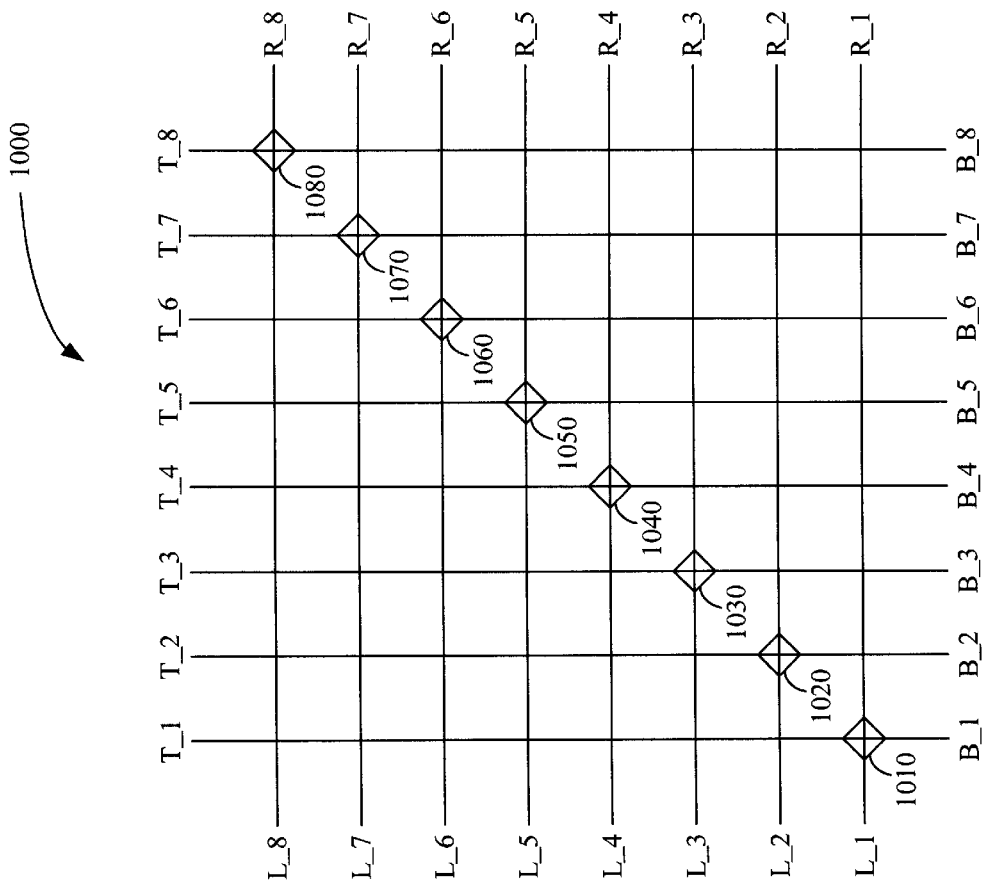
FIG. 10 is a simplified diagram of conventional programmable switch matrix (PSM).

To convert programmable interconnect 130 to reduced interconnect 330, the PSMs of programmable interconnect 130 are replaced by RMs (routing matrices). With the replacement of PSMs with RMs, the wires forming reduced interconnect 330 are minimized due to the placement of the RMs. FIG. 10 shows a conventional PSM 1000. PSM 1000 comprises 8 programmable interconnect points (PIPs) 1010, 1020, 1030, 1040, 1050, 1060, 1070, and 1080. Each PIP 10X0 is coupled to a left wire L_X, a right wire R_X, a top wire T_X, and a bottom wire B_X, where X is an integer from 1 to 8, inclusive. Each PIP 10X0 contains 6 pass transistors. Each pass transistor is coupled between two of the wires coming into PIP 10X0. The gate of the pass transistors are coupled to configuration memory cells (not shown). Thus, PIP 10X0 can configurably couple left wire L_X, right wire R_X, top wire T_X, and bottom wire B_X together in any combination.

Typically, in a standard cell integrated circuit, such as an RFPGA, vertical wires are one layer of the integrated circuit and horizontal wires are on a second layer of the integrated circuit. Thus, in conversion of PSM to RMs, PIPs are replaced with vias if a horizontal wire (i.e. left wires and right wires) is coupled to a vertical wire (i.e., top wires and bottom wires). The configuration memories, pass transistors, and unused wires of the PSM are removed. Thus, replacing the PIPs programmable interconnect 130 with the vias of reduced interconnect 330 greatly reduces the area required by reduced interconnect 330 as compared to programmable interconnect 130.

Figure 11A:
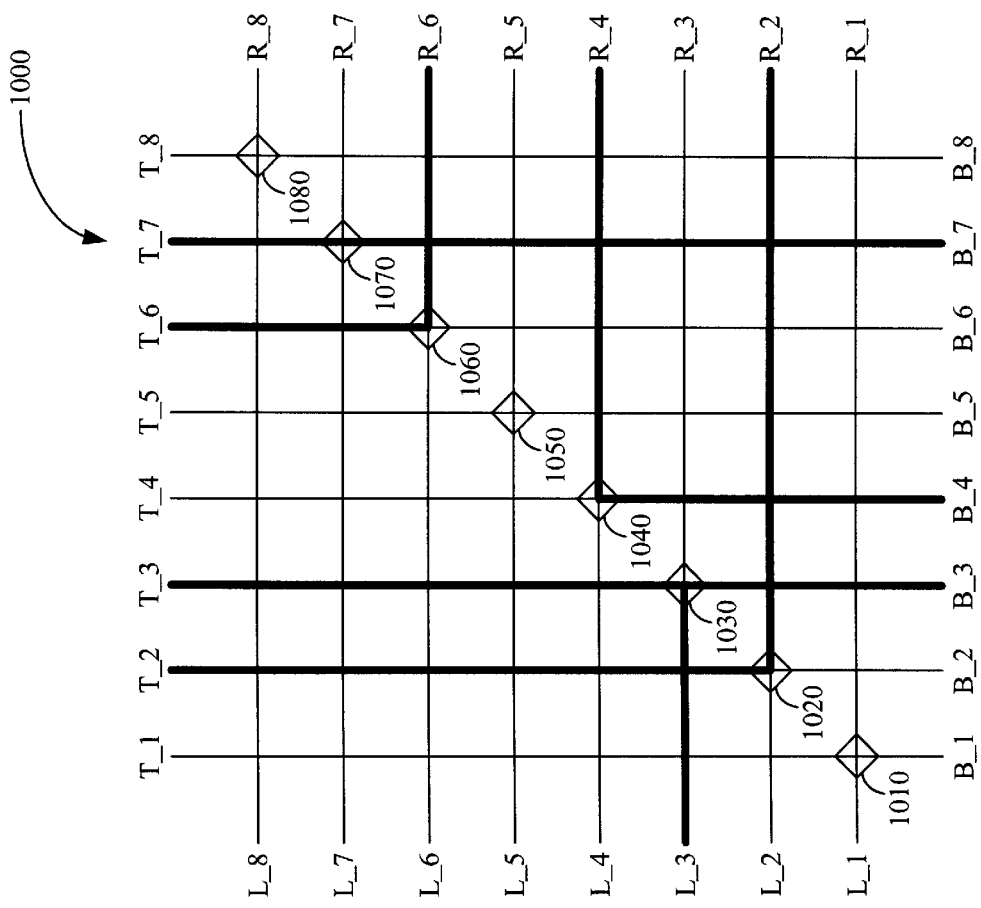
FIG. 11(a) is a simplified diagram of a configured programmable switch matrix (PSM).

FIGS. 11(a)–11(d) illustrates methods to convert a PSM into an RM. In FIG. 11(a), PSM 1000 is configured so that PIP 1020 couples top wire T_2 to right wire R_2. PIP 1030 is configured to couple top wire T_3 to bottom wire B_3 and left wire L_3. PIP 1040 is configured to couple bottom wire B_4 to right wire R_4. PIP 1060 is configured to couple top wire T_6 to right wire R_6. PIP 1070 is configured to couple top wire T_7 to bottom wire B_7. PIPS 1010, 1050, and 1080 are not used.

Figure 11B:
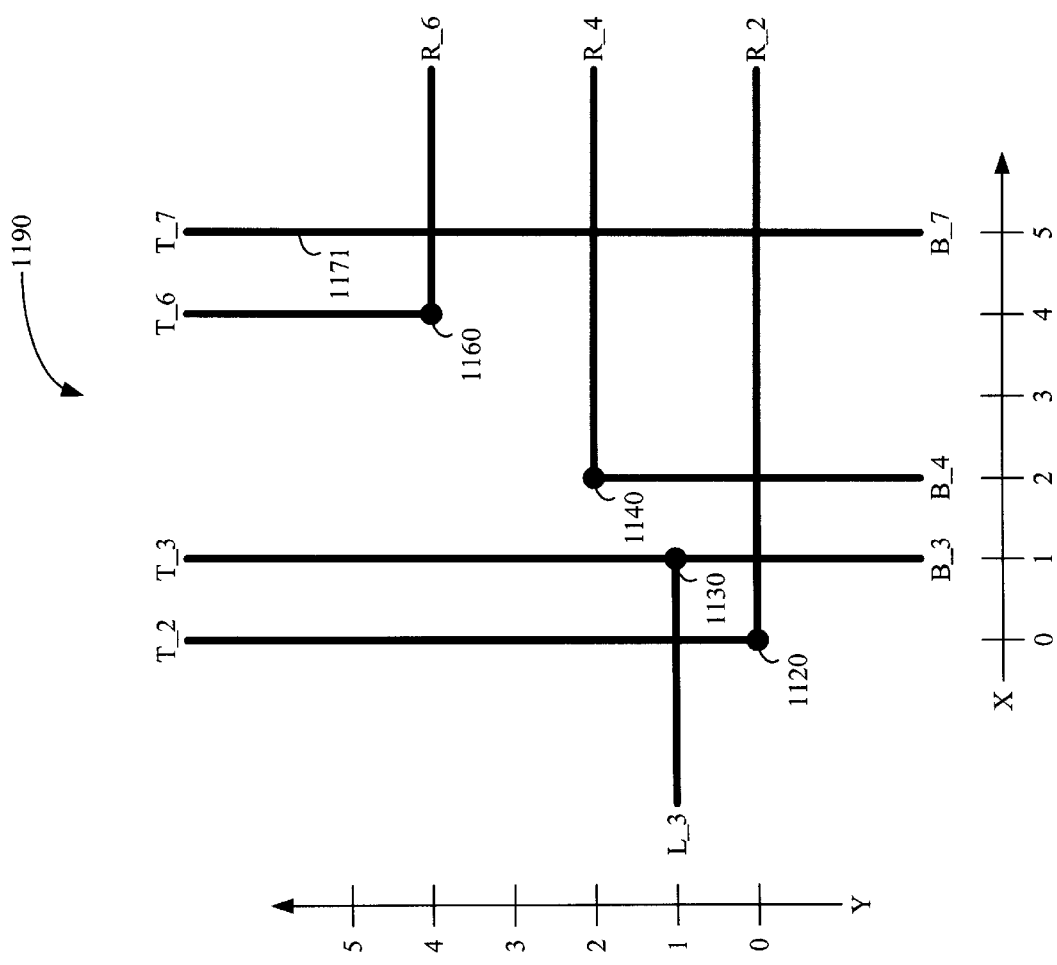
FIGS. 11(b)–11(f) are simplified diagrams of routing matrices (RM) in accordance with one embodiment of the present invention.

As shown in FIG. 11(b), in an RFPGA, the unused PIPs and wire are removed, and the used PIPs are replaced with vias or simple wiring. Specifically, PIPs 1010, 1050, and 1080 are removed. Similarly, top wires T_1, T_4, T_5, and T_8, bottom wires B_1, B_2, B_5, B_6, and B_8, left wires L_1, L_2, L_4, L_5, L_6, L_7, and L_8, and right wires R_1, R_3, R_5, R_7, R_8 are removed. Vias 1120, 1130, 1140, and 1160 replace PIPs 1020, 1030, 1040, and 1060, respectively. PIP 1070 is also removed and top wire T_7 and bottom wire B_7 are treated as a single wire 1171 in RM 1190. For convenience and clarity a coordinate system is provided on FIGS. 11(b)–11(d). Specifically, an X coordinate increases from left to right at a rate of 1 for each possible wire channel, a Y coordinate increases from bottom to top at a rate of 1 for each possible wire channel, and via 1120 is defined as the origin. Coordinates are given in the format (X,Y). Thus via 1120 has a coordinate of (0,0).

Figure 11D:
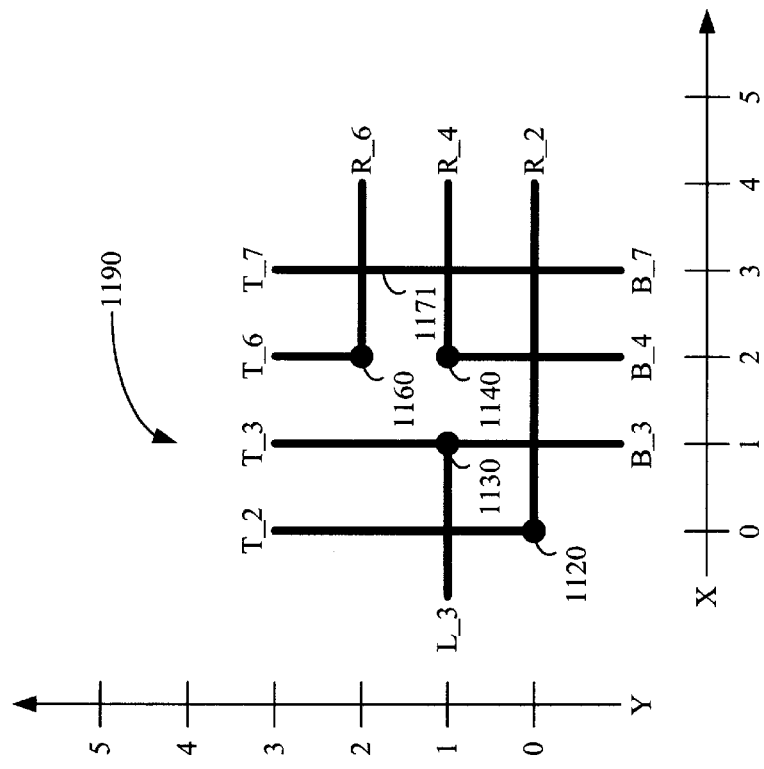
Figure 11C:
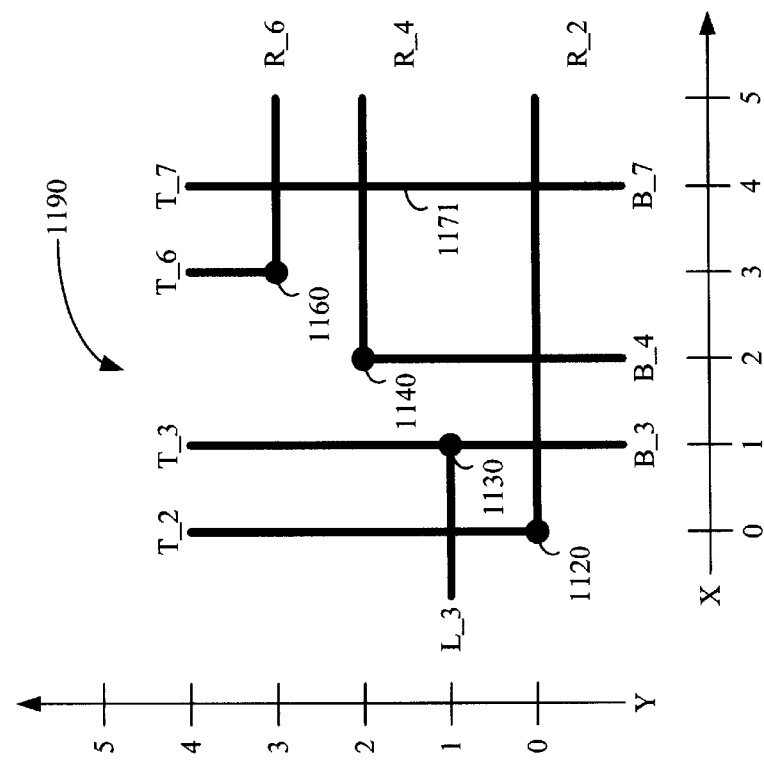

After the removal and replacement of PSM components with RM components, the area of RM 1190 can be reduced as compared to the area of PSM 1000. As illustrated in FIG. 11(c), excess area in RM 1190 is removed by moving the vias and wires as close together as possible. Specifically, via 1160 is moved to coordinate (3,3). Consequently, top wire T_6 is moved to have an X coordinate value equal to 3 and right wire R_6 is moved to have a Y coordinate value equal to 3. After moving top wire T_6, wire 1171 can be moved to have an X coordinate value equal to four. Thus after reduction, RM 1190 has a height equal to four wire channels and a width equal to five wire channels (in contrast to a height and width of eight wire channels as required without reduction as shown in FIG. 11(b)).

In some embodiment of the present invention, an optimization is performed to further reduce the area of RM 1190. As illustrated in FIG. 11(d), via 1140 can be moved to coordinate (2,1), which moves right wire R_4 to have a Y coordinate value equal to one, without causing any short circuits. Similarly, via 1160 can be moved to coordinate (2,2) and top wire T_6 can be moved to have an X coordinate value equal to two without causing any short circuits. In addition, after moving top wire T_6 and via 1160, wire 1171 can be moved to have an X coordinate value equal to three. Thus by optimizing the positioning of vias 1140 and 1160, the height of RM 1190 is reduced to three wire channels and the width of RM 1190 is reduced to four wire channels.

A method to reduce the area of an RM in accordance with one embodiment of the present invention is to begin by defining a corner via, e.g. the leftmost and bottommost via, as the origin. The next nearest via (or wire if a wire has no via) is them moved to an integer coordinate which minimizes the distance between the via and the origin without causing short circuits. Wires coupled to the via are moved with the via. If two possible coordinates are equally close to the origin, then either coordinate can be chosen. However, if minimizing height or width has priority, then the coordinate which minimizes the priority dimension should be chosen. When moving a wire such as wire 1171, the distance between the wire and the origin is defined as the length of the line which is perpendicular to the wire and connects to the origin. This process is repeated for each via or wire in the RM.

Using FIGS. 11(a)–(d) as an example, via 1120 is initially defined as the origin. The goal is to move via 1130 closer to the origin without causing a short circuit. Because via 1130 can not be moved to either coordinate (0,1) or coordinate (1,0), via 1130 remains at coordinate (1,1). Then attempt to minimize the distance of via 1140 to the origin. As illustrated in FIG. 11(d), via 1140 can be moved to coordinate (2,1) which is closer to the origin than coordinate (2,2) (the initial coordinate of via 1140) without causing any short circuits. Thus, via 1140 is moved to coordinate (2,1). Then, minimize the distance of via 1160, as shown in FIG. 11(d), by placing via 1160 at coordinate (2,2), which minimizes the distance of via 1160 to the origin without causing short circuits. Finally, move wire 1171 to have an X coordinate of three, which minimizes the distance between the origin and wire 1171

Figure 11E:
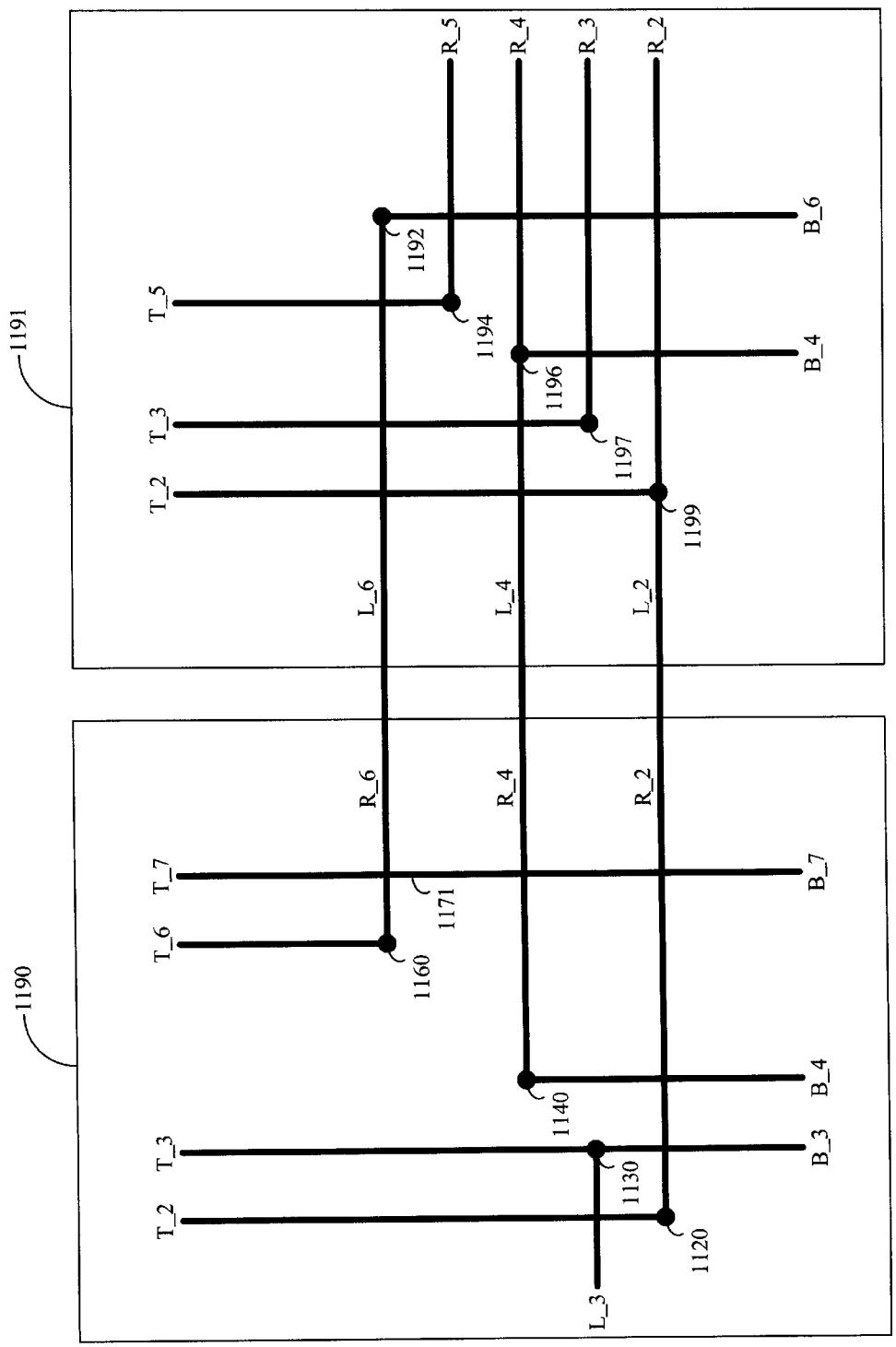
Figure 11F:
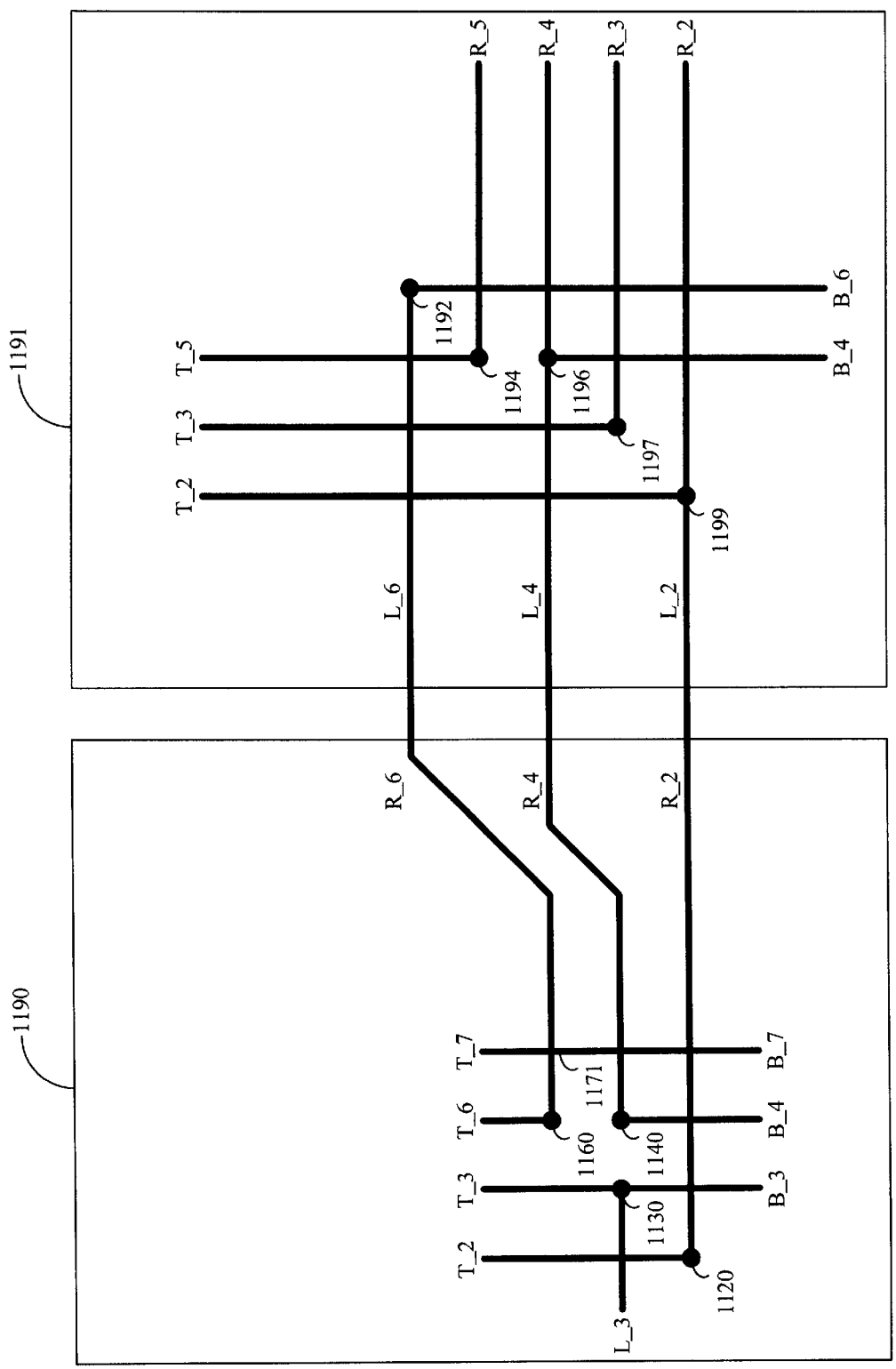

Because reduced interconnect 330 connects a large number of RLBs both vertically and horizontally, moving vias and wires in one RM may create complications for adjacent RMs. FIG. 11(e) illustrates the connections between RM 1190 and an RM 1191. Specifically, RM 1191 has a via 1192 coupled to via 1160, a via 1194 not coupled to any vias of RM 1190, a via 1196 coupled to via 1140, a via 1197 not coupled to any via of RM 1190, and a via 1199 coupled to via 1120. As illustrated in FIG. 11(f), after optimization of RM 1190 and RM 1191, the various vias coupled between RM 1190 and RM 1191 may not be in the same wire channel. For example, via 1160 is two wire channels below via 1192. Diagonal routing as illustrated in FIG. 11(f) can be used to couple the vias together. Furthermore, diagonal routing may also be used within each RM. In other embodiments, additional optimization such as swapping the Y coordinates of via 1196 and via 1197 may be used to reduce the need for diagonal routing. However, swapping coordinates of vias may cause additional complications. Thus, an iterative method involving multiple passes of moving and swapping vias and wires can be used to optimize the placement of vias and wires in creating the reduced interconnect. Furthermore, in some embodiments of the present invention, additional metal layers are available for use in the construction of reduced interconnect 330. These additional metal layers may include the use of diagonal wires to further optimize the area required for the reduced interconnect.

Reduction of IOBs to RIOBs

Figure 12A:
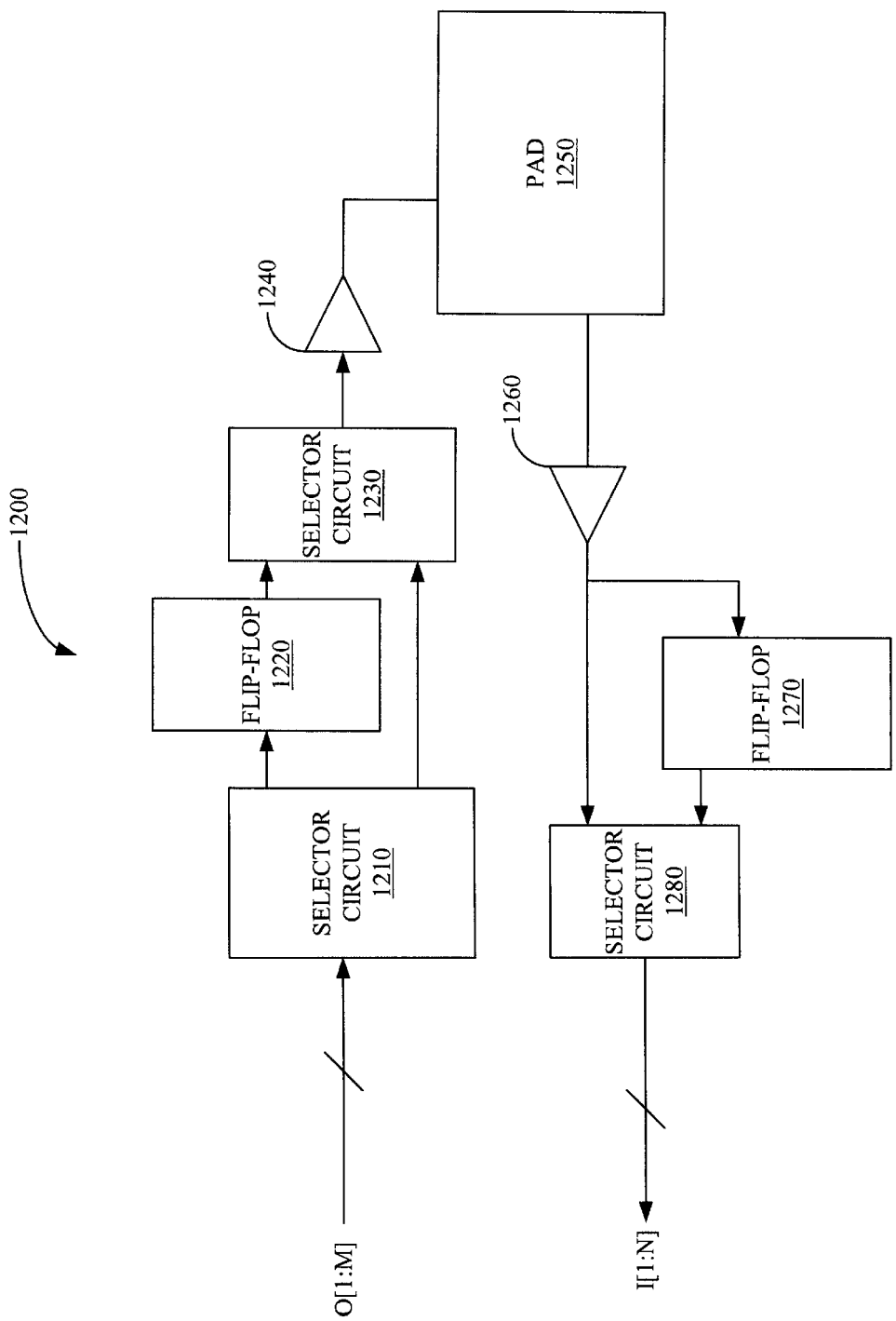
FIG. 12(a) is a simplified block diagram of a conventional input/output block (IOB).

Like RLBs, RIOBs are produced by removing unused components and reducing each used component of an IOB by removing configuration circuits. FIG. 12(a) shows a simplified block diagram of a conventional IOB 1200. The present invention is applicable to a variety of IOBS. IOB 1200 is merely one example of an IOB which can be used with the present invention. IOB 1200 includes selector circuits 1210 1230, and 1280, an output flip-flop 1220, an input flip-flop 1270, an output buffer 1240, an input buffer 1260, and a bonding pad 1250. IOB 1200 can be configured to receive data from and/or to drive data to bonding pad 1250. Furthermore, IOB 1200 can be configured to register both outgoing and incoming data using output flip-flop 1220 and input flip-flop 1270, respectively. Some embodiments of IOB 1200 may also include enable/disable circuits for output buffer 1240.

Specifically, various output signals O[1:M] are received by selector circuit 1210. Selector circuit 1210 is configured to drive an output signal to output flip-flop 1220 and selector circuit 1230. Output flip-flop 1220 is configured to register the signal from selector circuit 1210. Selector circuit 1230 is configured to drive either an output signal from output flip-flop 1220 or the output signal from selector circuit 1210 to output buffer 1240. If IOB 1200 is an output block or an input/output block, then output buffer 1240 is configured to drive the signal from selector circuit 1230 to bonding pad 1250 using an appropriate external voltage and current.

If IOB 1200 is an input block or an input output block, then data signals from outside the FPGA are received on bonding pad 1250. Input buffer 1260 converts the signals on bonding pad 1250 to an appropriate internal voltage and current and provides an input signal to input flip-flop 1270 and selector circuit 1280. Input flip-flop 1270 is configured to register the input signal from input buffer 1260. Selector circuit 1280 is configured to drive input signals I[1:N], with either the input signal from input buffer 1260 or the output signal of input flip-flop 1270.

Figure 12B:
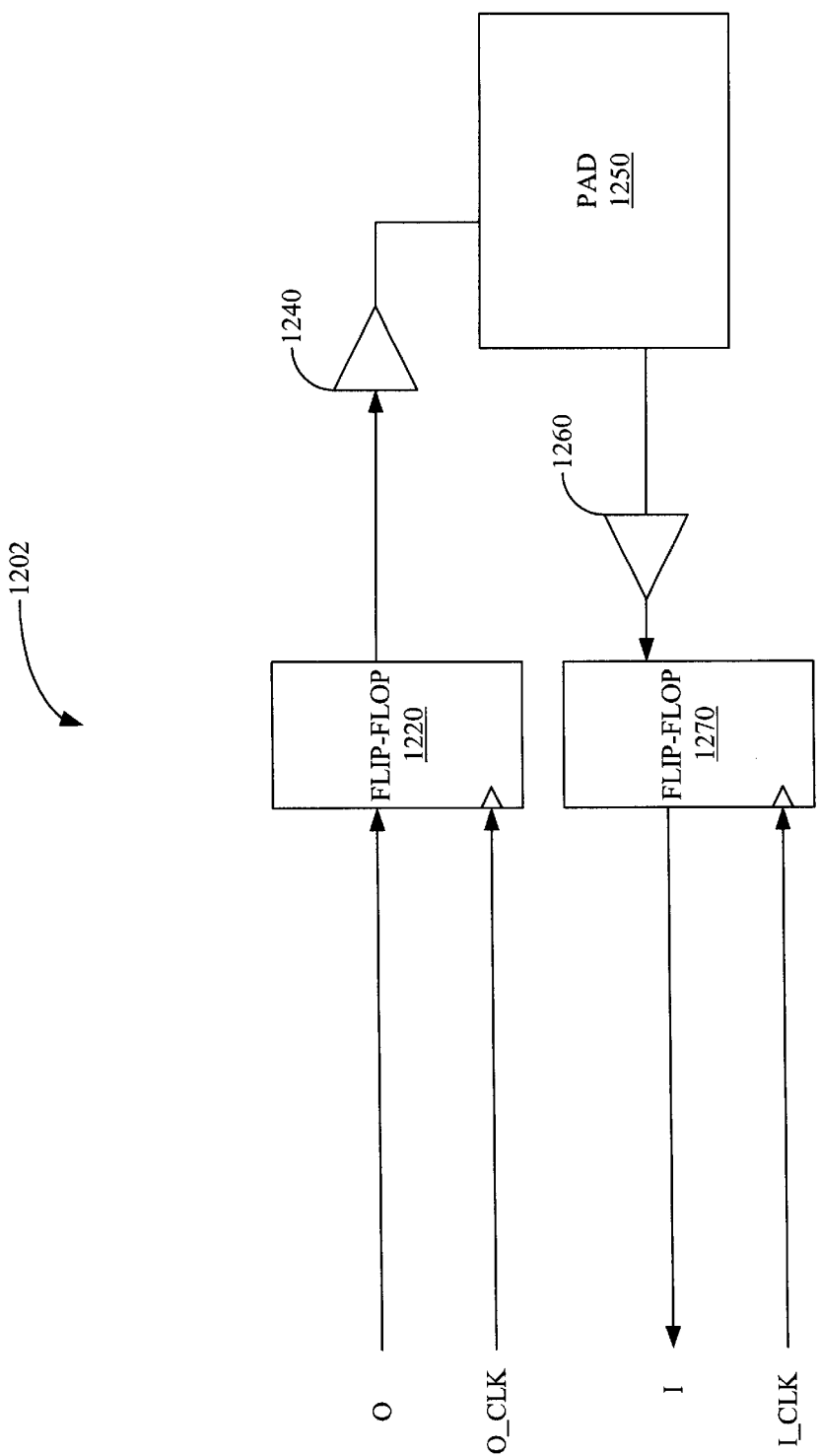
FIG. 12(b) is a simplified block diagram of a reduced input/output block (RIOB) in accordance with one embodiment of the present invention.

In converting IOB models to RIOB models, unused components are removed. Thus, the area required by an RIOB is reduced as compared to the area of an IOB. For example, if IOB 1200 is used exclusively as an input block, the corresponding RIOB model would not include selector circuits 1210, output flip-flop 1220, selector circuit 1230 or output buffer 1240. Conversely, if IOB 1200 is used exclusively as an output block, the corresponding RIOB model would not include input buffer 1260, input flip-flop 1270, or selector circuit 1280. Furthermore, if IOB 1200 is not configured to use registered input signals or registered output signals, input flip-flop 1270 or output flip-flop 1220 is removed, respectively. Typically, selector circuits 1210, 1230, and 1280 are formed using one or more multiplexers having selection input terminals coupled to configuration memory cells. Thus, in the RIOB model, selector circuits 1210, 1230, and 1280 are replaced with the appropriate wiring nets dictated by the configuration of the selector circuits. FIG. 12(b) shows a model for a registered bi-directional RIOB 1202 having flip-flops 1220 and 1270, buffers 1240 and 1260, and bonding pad 1250. Note that selector circuits 1210, 1230 and 1280 and any associated wiring paths (FIG. 12(a)) are removed from RIOB 1202. Thus, the area required by an RIOB is reduced as compared to the area of an IOB.

Figure 13:
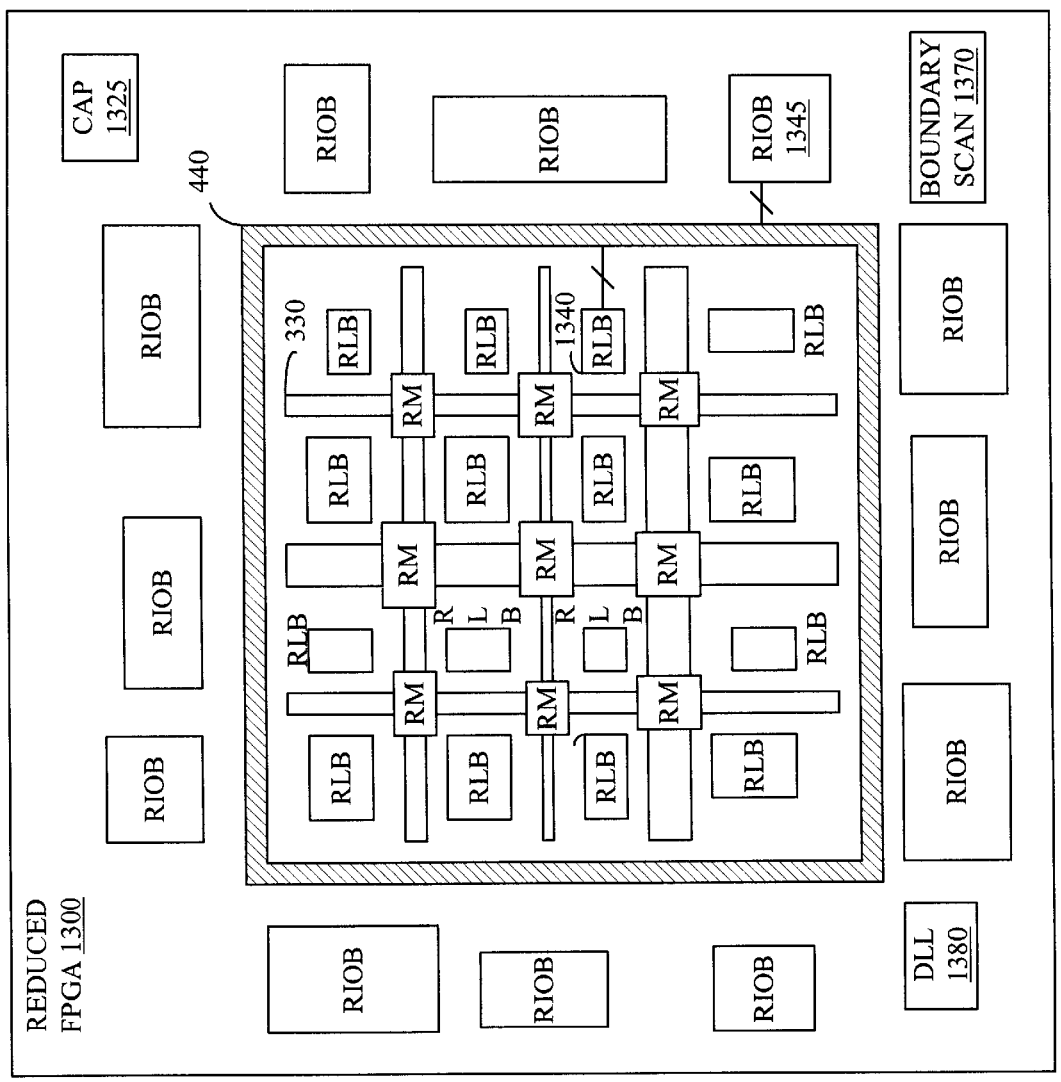
FIG. 13 is a block diagram of a reduced FPGA in accordance with one embodiment of the present invention.

For some RFPGAs, the area required by the RLBs, RMs and reduced interconnect 330 (FIG. 4(a)) may be much less than the area inside routing ring 440 because the size of routing ring 440 is also dictated by the RIOBs. In these cases, the benefits of forming RLBS, RMs, and reduced interconnect 330 may be lost since much of the area of the RFPGA is wasted. One method to reduce the size of the routing ring 440 is to eliminate RIOBS that correspond to unused IOBs. Thus, for example if an FPGA has 240 IOBs, but the FPGA design only uses 160 IOBs, then the RFPGA need only include 160 RIOBs around routing ring 440. As shown in FIG. 13, deletion of RIOBs may cause misalignment of RIOBs and the corresponding RLBs. Specifically in FIG. 13, RIOB 1345 corresponds to RLB 1340; however, due to the reduction process RIOB 1345 is not aligned with RLB 1340. In accordance with the present invention, because RLB 1340 is coupled to routing ring 440 and RIOB 1345 is coupled to routing ring 440 rather than directly to other, the misalignment of RIOB 1345 and RLB 1340 does not impact the reduction process of RIOB 1345 and RLB 1340. The misalignment is handled within routing ring 440. As explained above, routing ring 440 comprises wires which are defined to connect a point on the inner routing grid and a point on the outer routing grid. If misalignments are severe, then the thickness on any given side of routing ring 440 may be increased to accommodate more wiring channels.

RFPGA Timing Issues

The internal timing of an FPGA may differ from the internal timing of a corresponding RFPGA. Specifically, although the speed of the logic circuits generally do not change significantly, the propagation delays in RFPGAs are less than the propagation delays of the FPGA. Thus, in general, an RFPGA performs faster than a corresponding FPGA. In most cases, faster performance is desirable. Thus, timing issues may not need to be addressed unless specific additional timing constraints must be met.

Figure 14:
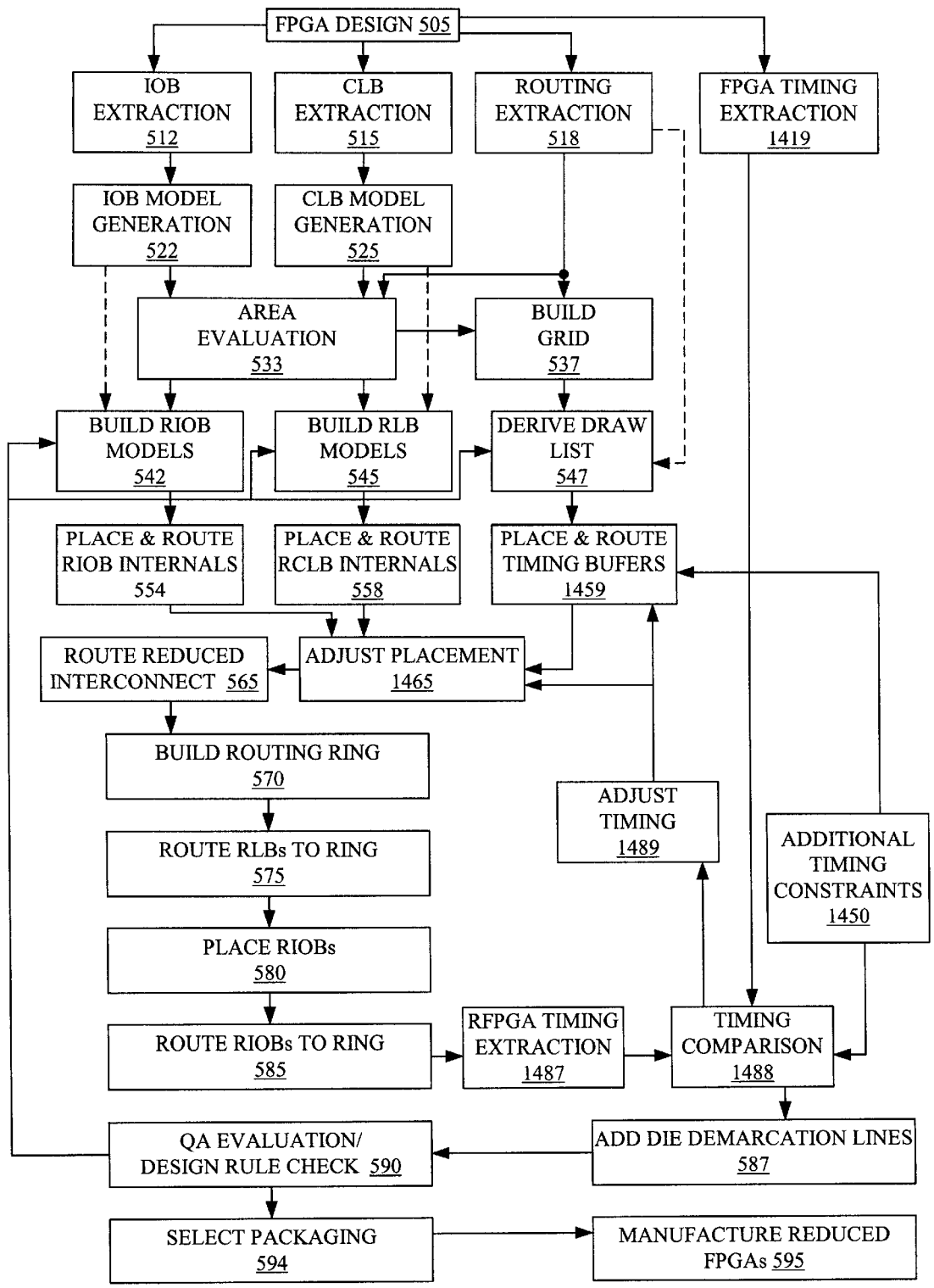
FIG. 14 is a flow diagram of a method to convert an FPGA design file into a reduced FPGA in accordance with one embodiment of the present invention.

FIG. 14 shows a flow diagram illustrating a method to convert an FPGA into an RFPGA and to adjust timing in the RFPGA in accordance with one embodiment of the present invention. Because FIG. 14 is similar to FIG. 5, the same reference numerals are used in FIG. 14 for similar steps. For brevity, the description of these similar steps is not repeated. In the method of FIG. 14, an FPGA timing extraction step 1419 is performed to ascertain the internal timing information for FPGA design 505.

Adjustment of the internal of the RPFGA is performed in an iterative manner. Initially, the RPFGA model is formed as described above with respect to FIG. 5 up to and including route RIOBs to ring step 585. However, some initial timing buffers may be included in place and route timing buffers step 1459 due to additional timing constraints 1450 provided by the user. The internal timing of the RFPGA is extracted in RFPGA timing extraction step 1487.

The internal FPGA timing is compared to the internal RPFGA timing in timing comparison step 1488. Some embodiments allow additional timing constraints 1450 to be placed on the RFPGA. If the internal timing of the RFPGA matches the internal timing of FPGA design 505 and satisfies additional constraints 1450, then processing continues as described above in add die demarcation step 587. Otherwise, adjust timing step 1489 attempts to remedy the problem detected by timing comparison step 1488 by adjusting the timing buffers and placement of components.

Thus, place and route timing buffer step 1459 must be performed again using the new data from adjust timing step 589. In some embodiments, additional optimization to allow different RLBs and RIOB models to increase or decrease time delays may also be used. Similarly, adjust placement step 1465 is performed to accommodate the changes. In some embodiments, the size and shape of the models may be modified to achieve the desired timing requirements. Thus, the RIOB or RLB models may be rebuilt in build RIOB model step 542 or build RLB models step 545. Then, the RFPGA model is recreated and timing is again compared as explained above.

When additional timing constraints step 1450 is not included, the internal timing of the RFPGA can be made to closely match the internal timing of FPGA design 505. Thus, the RFPGA can be a direct replacement for the FPGA in the user's system. The inclusion of additional timing constraints step 1450 allows the user to have flexibility to adjust all, some, or none of the data paths of an RFPGA to fine tune the timing of the RFPGA to maximize performance of the RFPGA as well as the user's system that includes the RFPGA.

General Methodology for Developing RFPGA Tools

In general, the methodology of creating RFPGAs tools can be approached in stages to permit faster implementation of the tools. The first stage is to reuse the existing FPGA implementation for CLBs and IOBs. However, the unneeded programming elements would be removed and the routing structure would be replaced using standard cell techniques.

The second stage replaces specific FPGA elements with smaller elements. For example, IOBs are replaced with RIOBs, and CLBs are replaced with RLBs. As explained above, some or all of the RIOBs and RLBs may be in pre-existing databases rather than generated each time an FPGA is converted to an RFPGA. If CLBs or IOBs are encountered that do not have corresponding RLBs or RIOBs in the database, then a new RLB or RIOB model is created and can be added to the database.

In the third stage, various other improvements such as iterative area evaluation can be added to further reduce area. For example, as described above, the shape and size of an RLB may be repeatedly recalculated based on the size and shapes of other RLBs. Thus, the shape and size of an RLB can be iteratively calculated based on the shape and size of other RLBs. Furthermore, the shape and size of an RLB may also be recalculated based on the interconnect, RIOBs, and routing ring. Thus, the area of any component of the RFPGA can be iteratively calculated based on the shape and size of other components in the RFPGA. Accordingly, multiple levels of iterative area evaluation can used to minimize the area required by the RFPGA.

Thus, different RFPGA tools for creating RFPGAs can be created in a staged manner. Simpler tools to use the some of principles of the present invention can be first implemented to allow users quick access to the benefits of RFPGAs. Then additional tools can be implemented to use advanced principles of the present invention to reduce the size and cost of RFPGAs. Iterative tools can then be added to further minimize the size and cost of RFPGAs.

In the various embodiments of this invention, methods and structures have been described to convert an FPGA design into an RFPGA. Specifically, a model for each component, such as CLBs, IOBs, and PSMs, of the FPGA is extracted from the FPGA design file. The CLBs, IOBs, and PSMs are individually reduced to form RLBs, RIOBs, and RMs, respectively. The area required by the reduced components of the RFPGA is less than the area of the equivalent component of the FPGA. Thus, the semiconductor area required for an RFGA is less than the semiconductor area of the FPGA. Furthermore, the RFPGA is manufactured using standard cell libraries and does not require configuration. Therefore, the cost to use an RFPGA is greatly reduced as compared to an FPGA.

The various embodiments of the structures and methods of this invention that are described above are illustrative only of the principles of this invention and are not intended to limit the scope of the invention to the particular embodiments described. For example, in view of this disclosure, those skilled in the art can define other ICs, standard cells, logic blocks, FPGAs, CLBs, IOBs, PSMs, RLBs, RIOBs, RMs, routing rings and so forth, and use these alternative features to create a method, circuit, or system according to the principles of this invention. Thus, the invention is limited only by the following claims.

What is claimed is:

1. A method to control signal timing on a plurality of signal paths in a reduced field programmable gate array (RFPGA) model derived from configuration data of a field programmable gate array (FPGA), the method comprising:

comparing signal timing on the signal paths against signal timing constraints; and changing the signal paths to satisfy the signal timing constraints.

2. The method of claim 1, wherein the signal timing constraints are based on the FPGA.

3. The method of claim 1, wherein the signal timing constraints are based on additional timing constraints specified by a user in addition to timing constraints based on the FPGA.

4. The method of claim 1, wherein changing the signal paths to satisfy the signal timing constraints comprises adding timing buffers to the signal paths.

5. The method of claim 1, wherein changing the signal paths to satisfy the signal timing constraints comprises adding vias to the signal paths.

6. The method of claim 1, wherein changing the signal paths to satisfy the signal timing constraints comprises increasing the net length of the signal paths.

7. The method of claim 1, wherein changing the signal paths to satisfy the signal timing constraints comprises decreasing the net length of the signal paths.

8. The method of claim 1, wherein changing the signal paths to satisfy the signal timing constraints comprises modifying the RFPGA model.

9. The method of claim 8, wherein modifying the RFPGA model comprises:

modifying placement of a plurality of reduced logic block models; and rerouting the signal path.

10. The method of claim 9, further comprising modifying the reduced logic block models.

\* \* \* \* \*